US011525083B2

(12) United States Patent
Kwon et al.

(10) Patent No.: US 11,525,083 B2
(45) Date of Patent: Dec. 13, 2022

(54) CORE SHELL QUANTUM DOT, PRODUCTION METHOD THEREOF, AND ELECTRONIC DEVICE INCLUDING THE SAME

(71) Applicant: SAMSUNG ELECTRONICS CO., LTD., Suwon-si (KR)

(72) Inventors: Soo Kyung Kwon, Suwon-si (KR); Seon-Yeong Kim, Suwon-si (KR); Yong Wook Kim, Yongin-si (KR); Ji-Yeong Kim, Suwon-si (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/851,539

(22) Filed: Apr. 17, 2020

(65) Prior Publication Data
US 2020/0332191 A1 Oct. 22, 2020

(30) Foreign Application Priority Data

Apr. 18, 2019 (KR) .................. 10-2019-0045760

(51) Int. Cl.
*C09K 11/88* (2006.01)
*H01L 27/32* (2006.01)
(Continued)

(52) U.S. Cl.
CPC .......... *C09K 11/883* (2013.01); *C09K 11/025* (2013.01); *G02B 6/005* (2013.01);
(Continued)

(58) Field of Classification Search
CPC ............ H01L 27/3244; H01L 27/3222; C09K 11/883; C09K 11/025; B82Y 20/00; B82Y 40/00; G02B 6/005
See application file for complete search history.

(56) References Cited

U.S. PATENT DOCUMENTS 6,288,285 B1 * 9/2001 Aoki .................... C07C 29/095
549/514
6,322,901 B1 11/2001 Bawendi et al.
(Continued)

FOREIGN PATENT DOCUMENTS

CN 107663452 A 2/2018
CN 111234822 A 6/2020
(Continued)

OTHER PUBLICATIONS

Jianhai Zhou et al., "Ideal CdSe/CdS core/shell nanocrystals enabled by entropic ligands and their core size-, shell thickness-, and ligand-dependent photoluminescence properties," Journal of the American Chemical Society, Nov. 2, 2017, pp. 1-33.
(Continued)

*Primary Examiner* — Michael M Trinh
(74) *Attorney, Agent, or Firm* — Cantor Colburn LLP

(57) ABSTRACT

A quantum dot comprising zinc, tellurium, and selenium and not comprising cadmium, wherein a maximum luminescent peak of the quantum dot is present in a wavelength range of greater than about 470 nanometers (nm) and a quantum efficiency of the quantum dot is greater than or equal to about 10%, and wherein the quantum dot comprises a core comprising a first semiconductor nanocrystal and a semiconductor nanocrystal shell disposed on the core.

23 Claims, 12 Drawing Sheets

(51) Int. Cl.
 B82Y 20/00 (2011.01)
 C09K 11/02 (2006.01)
 F21V 8/00 (2006.01)
 B82Y 40/00 (2011.01)
(52) U.S. Cl.
 CPC ........ H01L 27/322 (2013.01); H01L 27/3244 (2013.01); *B82Y 20/00* (2013.01); *B82Y 40/00* (2013.01)

(56) References Cited

U.S. PATENT DOCUMENTS

| | | | |
|---|---|---|---|
| 6,861,155 | B2 | 3/2005 | Bawendi et al. |
| 7,105,051 | B2 | 9/2006 | Peng et al. |
| 7,427,523 | B2 | 9/2008 | Boardman et al. |
| 8,035,772 | B2 | 10/2011 | Kim et al. |
| 8,252,205 | B2 | 8/2012 | Jun et al. |
| 8,436,964 | B2 | 5/2013 | Kim et al. |
| 8,545,736 | B2 | 10/2013 | Jun et al. |
| 9,082,982 | B2 | 7/2015 | Jun et al. |
| 9,606,281 | B2 | 3/2017 | Jang et al. |
| 9,698,311 | B2 | 7/2017 | Greco et al. |
| 9,834,724 | B2 | 12/2017 | Kim et al. |
| 9,933,658 | B2 | 4/2018 | Jang et al. |
| 10,270,036 | B2 | 4/2019 | Ito et al. |
| 10,424,695 | B2 | 9/2019 | Won et al. |
| 10,472,562 | B2 | 11/2019 | Lee et al. |
| 10,597,580 | B2 | 3/2020 | Min et al. |
| 11,355,583 | B2 | 6/2022 | Kwon et al. |
| 2005/0214536 | A1* | 9/2005 | Schrier .................. H01L 33/28 |
| | | | 428/403 |
| 2006/0157720 | A1* | 7/2006 | Bawendi ................. C30B 29/40 |
| | | | 257/98 |
| 2008/0138514 | A1 | 6/2008 | Jang et al. |
| 2010/0110728 | A1 | 5/2010 | Dubrow et al. |
| 2010/0283072 | A1 | 11/2010 | Kazlas et al. |
| 2011/0245533 | A1* | 10/2011 | Breen ..................... C30B 33/00 |
| | | | 562/8 |
| 2012/0113671 | A1 | 5/2012 | Sadasivan et al. |
| 2012/0113672 | A1 | 5/2012 | Dubrow et al. |
| 2013/0299772 | A1 | 11/2013 | Cohen et al. |
| 2016/0096992 | A1 | 4/2016 | Guo et al. |
| 2018/0033856 | A1 | 2/2018 | Kwon et al. |
| 2018/0094190 | A1 | 4/2018 | Kim et al. |
| 2018/0119007 | A1 | 5/2018 | Ippen et al. |
| 2018/0180944 | A1 | 6/2018 | Jang et al. |
| 2019/0119569 | A1* | 4/2019 | Lee .......................... C09K 11/02 |
| 2019/0153317 | A1* | 5/2019 | Kim ....................... C09K 11/565 |
| 2019/0276737 | A1* | 9/2019 | Won ........................ C09K 11/02 |
| 2019/0367810 | A1 | 12/2019 | Omata et al. |
| 2019/0378959 | A1 | 12/2019 | Won et al. |
| 2019/0390109 | A1* | 12/2019 | Ippen ..................... C09K 11/02 |
| 2020/0174288 | A1 | 6/2020 | Kim et al. |
| 2020/0291296 | A1 | 9/2020 | Mamuye et al. |
| 2020/0332186 | A1* | 10/2020 | Kim ........................ C09K 11/88 |
| 2020/0332190 | A1* | 10/2020 | Kim ....................... C09K 11/562 |
| 2021/0183999 | A1 | 6/2021 | Kwon et al. |

FOREIGN PATENT DOCUMENTS

| | | |
|---|---|---|
| JP | 2018115315 A | 7/2018 |
| KR | 1020070058072 A | 6/2007 |
| KR | 1020080093539 A | 10/2008 |
| KR | 1020090078547 A | 7/2009 |
| KR | 20110069836 A | 6/2011 |
| KR | 1020130044071 A | 5/2013 |
| KR | 1020140032811 A | 3/2014 |
| KR | 101525524 B1 | 6/2015 |
| KR | 101585430 B1 | 1/2016 |
| KR | 101699540 B1 | 1/2017 |
| KR | 1020170049452 A | 5/2017 |
| KR | 20170072742 A | 6/2017 |
| KR | 101762728 B1 | 7/2017 |
| KR | 20180013801 A | 2/2018 |
| KR | 20180068893 A | 6/2018 |
| KR | 1020180068893 A | 6/2018 |
| KR | 20180076294 A | 7/2018 |
| KR | 101895229 B1 | 9/2018 |

OTHER PUBLICATIONS

Kiran G Sonawane et al., "A case study: Te in ZnSe and Mn-doped ZnSe quantum dots," Nanotechnology, Jun. 27, 2011, pp. 1-7, vol. 22.

M. J. S. P. Brasil et al., "Evolution of the band gap and the dominant radiative recombination center versus the imposition for ZnSe I-XTeX alloys grown by molecular beam epitaxy," Applied Physics Letters, Mar. 8, 1991, pp. 2509-2511, vol. 58, No. 22.

Simon M. Fairclough et al., "Growth and Characterization of Strained and Alloyed Type-II ZnTe/ZnSe Core-Shell Nanocrystals," The journal of Physical chemistry, Nov. 18, 2012, pp. 26898-26907, vol. 116.

Vladimir Lesnyak et al., "Colloidal semiconductor nanocrystals: the aqueous approach," Chem. Soc. Rev, Nov. 20I, 2012, pp. 2905-2929, vol. 42.

Chunliang Li et al., "Synthesis of Cd-free water-soluble ZnSe1-xTex nanocrystals with high luminescence in the blue region," Journal of Colloid and Interface Science, Feb. 14, 2008, pp. 468-476, vol. 321.

Guozhi Jia et al., "Size Effect of Heterostructure Type in Core/Shell Quantum Dot," International Journal of Electrochemical Science, Jun. 1, 2013, pp. 8167-8174, vol. 8.

Hiroshi Asano et al., "Colloidal Zn(Te,Se)/ZnS Core/Shell Quantum Dots Exhibiting Narrow-Band and Green Photoluminescence," ACS Omega, Jun. 20, 2018, pp. 6703-6709, vol. 3.

Jiwon Bang et al., "ZnTe/ZnSe (Core/Shell) Type-II Quantum Dots: Their Optical and Photovoltaic Properties," Chemistry of Materials, Nov. 23, 2009, pp. 233-240, vol. 22.

H Asano et al., "Synthesis of colloidal Zn(Te,Se) alloy quantum dots," Materials Research Express, Octobers, 2017, pp. 1-10, vol. 4, Article id. 106501.

Non-Final Office Action dated Mar. 21, 2022 in U.S. Appl. No. 16/851,509.

Non-Final Office Action dated Mar. 28, 2022 in U.S. Appl. No. 16/851,520.

Office Action dated Sep. 26, 2022, of the corresponding Chinese Patent Application No. 202010310970.7 (family of co-pending U.S. Appl. No. 16/851,509).

Guozhi Jia et al., "Heterostructure tote transformation of ternary ZnTexSe1-x/ZnSe core/shell quantum dots," Digest Journal of Nanomaterilas and Biostructures, Jan.-Mar. 2011, pp. 45-53, vol. 6, No. 1.

Gonzalez et al., "Synthesis and Charazterization of Colloidal ZnTe/ZnS and ZnTe/ZnSe Quantum Dots," Honors Thesis Presented to the Department of Physics and Astronomy University of New Mexico. 2019, pp. 1-34, https://physics.unm.edu/pandaweb/undergraduate/programs/honorsThesis/2019_Gonzales.pdf.

* cited by examiner

CORE SHELL QUANTUM DOT, PRODUCTION METHOD THEREOF, AND ELECTRONIC DEVICE INCLUDING THE SAME

CROSS-REFERENCE TO RELATED APPLICATION

This application claims priority to and the benefit of Korean Patent Application No. 10-2019-0045760 filed in the Korean Intellectual Property Office on Apr. 18, 2019, and all the benefits accruing therefrom under 35 U.S.C. § 119, the entire content of which is incorporated herein by reference.

BACKGROUND

1. Field

A core-shell quantum dot, a production method thereof, and an electronic device including the same are disclosed.

2. Description of the Related Art

Unlike a bulk material, physical characteristics (e.g., energy bandgaps and melting points) of a nanoparticle may be controlled by changing a size of the nanoparticle. For example, a semiconductor nanocrystal particle (also known as a quantum dot) is a crystalline material having a size of several nanometers. The semiconductor nanocrystal particle has a relatively small size and thereby a large surface area per a unit volume, exhibiting a quantum confinement effect and having different properties than bulk materials having the same composition. A quantum dot may absorb light from an excitation source and become excited, emitting an energy corresponding to an energy bandgap of the quantum dot.

SUMMARY

An embodiment provides a cadmium-free quantum dot capable of realizing enhanced, e.g., improved, optical properties such as a luminous efficiency and a full width at half maximum (FWHM).

An embodiment provides a method of producing the aforementioned cadmium-free quantum dot.

An embodiment provides a quantum dot composite including the aforementioned cadmium-free quantum dot.

An embodiment provides an electronic device including the aforementioned cadmium-free quantum dot.

In an embodiment, a quantum dot includes zinc, tellurium, and selenium and does not include cadmium, wherein a maximum luminescent peak of the quantum dot is present in a wavelength range of greater than about 470 nanometers (nm) and a quantum efficiency of the quantum dot is greater than or equal to about 10%, and wherein the quantum dot includes a core including a first semiconductor nanocrystal and a semiconductor nanocrystal shell disposed on the core.

The semiconductor nanocrystal shell has a composition different from the first semiconductor nanocrystal.

In the quantum dot, a mole ratio of tellurium with respect to selenium (Te:Se) may be greater than or equal to about 0.2:1. In the quantum dot, a mole ratio of tellurium with respect to selenium (Te:Se) may be greater than or equal to about 1:1. In the quantum dot, a mole ratio of tellurium with respect to selenium (Te:Se) may be greater than or equal to about 1.5:1. In the quantum dot, a mole ratio of tellurium with respect to selenium (Te:Se) may be greater than or equal to about 1.9:1. In the quantum dot, a mole ratio of tellurium with respect to selenium (Te:Se) may be greater than or equal to about 2:1. In the quantum dot, a mole ratio of tellurium with respect to selenium (Te:Se) may be less than or equal to about 4:1. In the quantum dot, a mole ratio of tellurium with respect to selenium (Te:Se) may be less than or equal to about 2.5:1.

In the quantum dot, a mole ratio of tellurium with respect to zinc (Te:Zn) may be greater than or equal to about 0.1:1. In the quantum dot, a mole ratio of tellurium with respect to zinc (Te:Zn) may be greater than or equal to about 0.14:1, or greater than or equal to about 0.2:1. In the quantum dot, a mole ratio of tellurium with respect to zinc (Te:Zn) may be greater than or equal to about 0.3:1. In the quantum dot, a mole ratio of tellurium with respect to zinc (Te:Zn) may be less than or equal to about 0.5:1.

The quantum dot may further include aluminum, lithium, or a combination thereof.

The quantum dot may not include manganese, copper, or a combination thereof.

The quantum dot may not include a Group III-V compound (e.g., indium phosphide). The Group III-V compound may include indium, gallium, or a combination thereof.

A maximum photoluminescent peak of the quantum dot may be in a wavelength range of greater than or equal to about 480 nm. A maximum photoluminescent peak of the quantum dot may be in a wavelength range of greater than or equal to about 500 nm. A maximum photoluminescent peak of the quantum dot may be in a wavelength range of less than about 560 nm.

An ultraviolet-visible (UV-Vis) absorption spectrum of the quantum dot may include a first absorption peak and a valley adjacent thereto. In the UV-Vis absorption spectrum of the quantum dot, a valley depth (VD) defined by the following equation may be greater than or equal to about 0.01:

$$1-(\mathrm{Abs}_{valley}/\mathrm{Abs}_{first})=\mathrm{VD}$$

wherein, $\mathrm{Abs}_{first}$ is an absorption intensity at a wavelength of the first absorption peak and $\mathrm{Abs}_{valley}$ is an absorption intensity at a lowest point of the valley.

A full width at half maximum (FWHM) of the maximum photoluminescent peak of the quantum dot may be less than about 50 nm.

A full width at half maximum (FWHM) of the maximum photoluminescent peak of the quantum dot may be less than about 45 nm.

A full width at half maximum (FWHM) of the maximum photoluminescent peak of the quantum dot may be less than about 40 nm.

A full width at half maximum (FWHM) of the maximum photoluminescent peak of the quantum dot may be less than about 38 nm.

A full width at half maximum (FWHM) of the maximum photoluminescent peak of the quantum dot may be less than about 35 nm.

The quantum dot may have a quantum efficiency of greater than or equal to about 12%.

The quantum dot may have a quantum efficiency of greater than or equal to about 20%.

The quantum dot may have a quantum efficiency of greater than or equal to about 30%.

The quantum dot may have a quantum efficiency of greater than or equal to about 35%.

The first semiconductor nanocrystal may include zinc, tellurium, and selenium.

The semiconductor nanocrystal shell may include zinc; and at least one of selenium and sulfur (e.g., S, Se, or a combination thereof) e.g., ZnSe, ZnS, ZnSeS, or a combination thereof.

The first semiconductor nanocrystal or the quantum dot may include ZnTe$_x$Se$_{1-x}$, wherein x is greater than or equal to about 0.5 and less than or equal to about 0.9.

The semiconductor nanocrystal shell may include ZnSe, ZnS, ZnSeS, or a combination thereof.

The quantum dot may have a Zinc Blende crystalline structure in an X-ray diffraction analysis.

The quantum dot may include an organic ligand and the organic ligand may include RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR', RHPO(OH), RPO(OH)$_2$, R$_2$POOH, a polymeric organic ligand, or a combination thereof, wherein R and R' are the same or different and are each independently a substituted or unsubstituted C1 to C40 aliphatic hydrocarbon group, a substituted or unsubstituted C6 to C40 aromatic hydrocarbon group, or a combination thereof.

The organic ligand may not include an organic compound having a thiol moiety; and at least one of an amino group and a carboxylic acid group. The organic ligand may not include glutathione compound.

The quantum dot may be water-insoluble.

When being dispersed in water, the quantum dot may show an average particle size of greater than or equal to about 500 nm as determined by a dynamic light scattering (DLS) analysis.

When being dispersed in an organic solvent (such as toluene, octane, or the like), the quantum dot may be configured to form an organic solution having an average particle size of less than or equal to about 200 nm as determined by a DLS analysis.

In an embodiment, a quantum dot population includes a plurality of the aforementioned quantum dots, wherein an average roundness of the plurality of the aforementioned quantum dots may be greater than or equal to about 0.70.

The average roundness of the quantum dots may be greater than or equal to about 0.75.

The average roundness of the quantum dots may be greater than or equal to about 0.80.

An average particle size of the quantum dots may be greater than or equal to about 2 nm.

An average particle size of the quantum dots may be less than or equal to about 50 nm.

A standard deviation of the particle sizes of the quantum dots may be less than about 18% of an average size of the quantum dots.

The standard deviation of the particle sizes of the quantum dots may be less than about 12% of an average size of the quantum dots.

In an embodiment, a method of manufacturing the foregoing quantum dot includes:

preparing the core including the first semiconductor nanocrystal, the first semiconductor nanocrystal including zinc, tellurium, and selenium;

in a third organic solvent, in the presence of the core particle and a third organic ligand, reacting a zinc precursor with a selenium precursor, a sulfur precursor, or a combination thereof at a shell formation temperature to form the semiconductor nanocrystal shell on the core, the semiconductor nanocrystal shell including zinc, and at least one of selenium and sulfur, wherein the preparing of the core includes preparing a zinc precursor organic solution including a zinc precursor and a first organic ligand in a first organic solvent; and while heating the zinc precursor organic solution at a first reaction temperature, adding a selenium precursor, a tellurium precursor, a metal hydride compound, and a second organic ligand to the zinc precursor organic solution and wherein the tellurium precursor includes tellurium dispersed in a second organic solvent and a concentration of the tellurium in the tellurium precursor is greater than about 0.1 moles per liter.

In the preparing of the core, a mole ratio of an injected tellurium with respect to an injected selenium into a reaction system may be greater than about 0.25:1.

The first reaction temperature may be greater than or equal to about 280° C.

Prior to being added to the zinc precursor organic solution, the tellurium precursor, the metal hydride compound, and the second organic ligand may be mixed to form a mixed solution at a temperature of less than about 80° C.

The second organic ligand may include an aliphatic organic amine compound or a combination thereof.

The metal hydride compound may include lithium, aluminum, or a combination thereof.

In an embodiment, a quantum dot (e.g., polymer) composite includes a (e.g., polymer) matrix; and a plurality of quantum dots dispersed in the (polymer) matrix, wherein the plurality of quantum dots includes the aforementioned (core-shell) quantum dots.

The polymer matrix may include a cross-linked polymer, a binder polymer including a carboxylic acid group, or a combination thereof.

The cross-linked polymer may include a polymerization product of a photopolymerizable monomer including a carbon-carbon double bond, a polymerization product of the photopolymerizable monomer and a multiple thiol compound having at least two thiol groups (e.g., at a terminal end of the multiple thiol compound), or a combination thereof.

The quantum dot (e.g., polymer) composite may further include a metal oxide fine particle (e.g., dispersed in the polymer matrix).

In an embodiment, a display device includes a light emitting element, and the light emitting element comprises a plurality of the quantum dots.

The light emitting element may include a stacked structure including a patterned light emitting layer, the patterned light emitting layer may include a repeating section configured to emit light at a predetermined wavelength, and the first repeating section may include the quantum dots.

In an embodiment, a display device includes a light emitting element (e.g., a photoluminescent element) and optionally a light source, wherein the light emitting element includes the aforementioned quantum dot-polymer composite. If present, the light source is configured to provide the light emitting element with incident light.

The incident light may have a photoluminescence peak wavelength of about 440 nm to about 460 nm.

The light emitting element may include a sheet of the quantum dot polymer composite.

The light emitting element may include a stacked structure including a substrate and a light emitting layer (e.g., a photoluminescent layer) disposed on the substrate. The light emitting layer may include a pattern of the quantum dot polymer composite.

The pattern may include a, e.g., at least one or two, repeating section configured to emit light at a predetermined wavelength.

The display device may be configured to have color reproducibility of greater than or equal to about 80% under a BT2020 standard.

In an embodiment, a cadmium free quantum dot capable of emitting light with an enhanced, e.g., improved, efficiency and a reduced FWHM at a desired wavelength (e.g., greater than about 470 nm) may be provided. The quantum dot of an embodiment may be applied to, e.g., used in, various display devices, biolabeling (biosensor, bioimaging), a photodetector, a solar cell, a hybrid composite, or the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
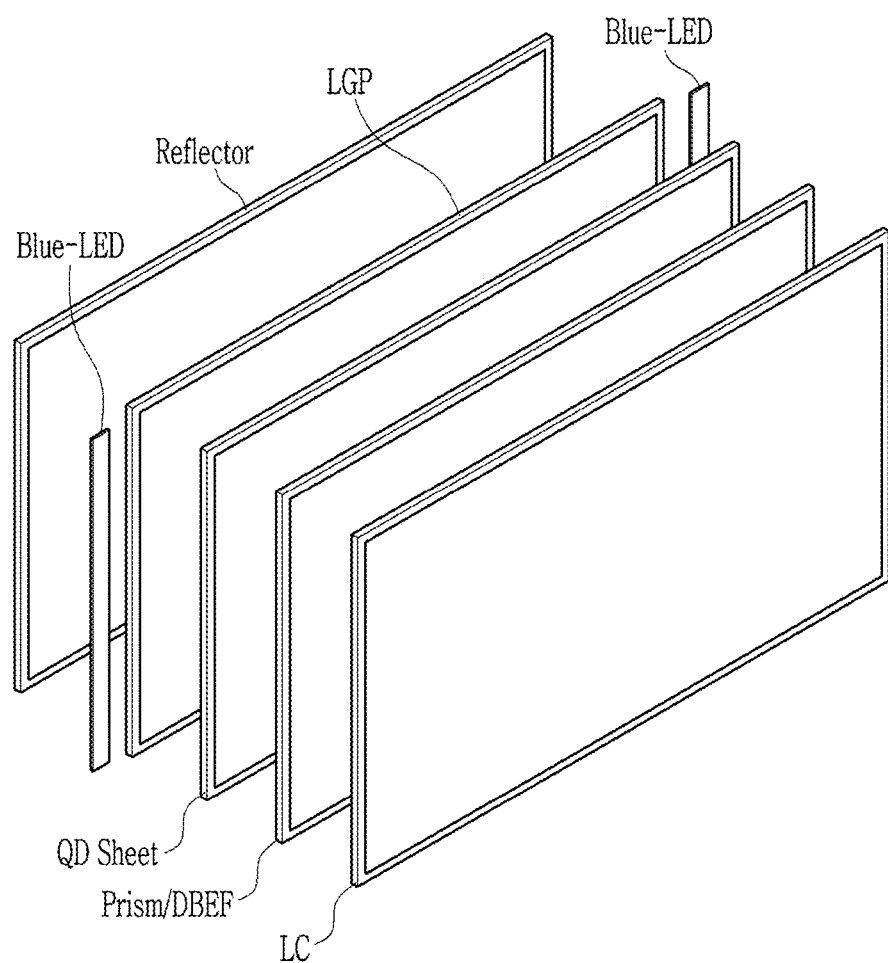
FIG. 1 is an exploded view of a display device according to an embodiment.

Advantages and characteristics of this disclosure, and a method for achieving the same, will become evident referring to the following example embodiments together with the drawings attached hereto. However, the embodiments should not be construed as being limited to the embodiments set forth herein. Unless otherwise defined, all terms used in the specification (including technical and scientific terms) may be used with meanings commonly understood by a person having ordinary knowledge in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" may refer to replacement of hydrogen of a compound or a group by a substituent of a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—O(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, a hydrocarbon group refers to a group including (or consisting of) carbon and hydrogen (e.g., an alkyl, alkenyl, alkynyl, or aryl group). The hydrocarbon group may be a group having a valence of one or greater formed by removal of a, e.g., at least one, hydrogen atom from alkane, alkene, alkyne, or arene. In the hydrocarbon group, a, e.g., at least one, methylene may be replaced by an oxide moiety, a carbonyl moiety, an ester moiety, —NH—, or a combination thereof.

Herein, "aliphatic" refers to a saturated or unsaturated linear or branched hydrocarbon group. An aliphatic group may be an alkyl, alkenyl, or alkynyl group, for example.

As used herein, "alkyl" refers to a linear or branched saturated monovalent hydrocarbon group (methyl, ethyl, hexyl, etc.).

As used herein, "alkenyl" refers to a linear or branched monovalent hydrocarbon group having one or more carbon-carbon double bond.

As used herein, "alkynyl" refers to a linear or branched monovalent hydrocarbon group having one or more carbon-carbon triple bond.

Herein, "aromatic" refers to an organic compound or group comprising a, e.g., at least one, unsaturated cyclic group having delocalized pi electrons. The term encompasses both hydrocarbon aromatic compounds and heteroaromatic compounds.

As used herein, "aryl" refers to a group formed by removal of a, e.g., at least one, hydrogen from an aromatic hydrocarbon (e.g., a phenyl or naphthyl group).

As used herein, "hetero" refers to one including one or more (e.g., 1 to 3) heteroatom of N, O, S, Si, P, or a combination thereof.

As used herein, the wording "Group" refers to a group of Periodic Table.

As used herein, "Group III" may refer to Group IIIA and Group IIIB, and examples of Group III metal may be In, Ga, and Tl, but are not limited thereto.

As used herein, "Group V" may refer to Group VA, and examples may include nitrogen, phosphorus, arsenic, antimony, and bismuth, but are not limited thereto.

In an embodiment, the wording "roundness" may refer to a definition as provided in The ImageJ User Guide (v 1.46r) and may be defined as below:

$$4\times\{[\text{Area}]/\pi\times[\text{major axis}]^2)\}$$

The above definition may correspond to a reciprocal number of an aspect ratio. The aspect ratio may be a ratio of a major axis with respect to a minor axis. The "Area" may be a two dimensional image area of a given particle and the major axis may refers to a main axis of the best-fitted oval shape of a given image. The roundness may be the one that can reflect a ratio between an inscribed circle and a circumscribed circle for a given object.

Semiconductor nanocrystal particles (hereinafter, also referred to as a quantum dots) may absorb light from an excitation source and may emit light corresponding to an energy bandgap of the quantum dots. The energy bandgap of the quantum dot may vary with a size and a composition thereof. For example, as the size of the quantum dot increases, the quantum dot may have a narrower energy bandgap and may exhibit an increased light emitting wavelength. Semiconductor nanocrystals may be used as a light emitting material in various fields such as a display device, an energy device, or a bio light emitting device.

Quantum dots having relatively increased photoluminescence properties may include cadmium (Cd). The cadmium may cause environmental issues, health issues, or a combination thereof and is one of the restricted elements under Restriction of Hazardous Substances Directive (RoHS) in many countries. Accordingly, development of a cadmium-free quantum dot having improved photoluminescence characteristics is desired. A cadmium free indium phosphide quantum dot (QD) may be applied, e.g., in an actual device.

In order to be applied to, e.g., used in, a quantum dot display device (e.g., including a color conversion layer including the quantum dot) and to realize a display device having a relatively high color reproducibility under a next generation color standard such as BT2020, a quantum dot having a relatively narrow full width at half maximum (FWHM) is desired. For example, in order for a device to achieve an enhanced, e.g., improved, color reproducibility under the BT2020 standard, a luminous material used therein may be desired to have a reduced level of a FWHM. However, in comparison with a Cd based core (e.g., a CdSe core), a Group III-V compound based quantum dot including indium and phosphorus has a smaller bandgap and a larger Bohr radius and thus changes in the FWHM depending on a size of the quantum dot may be significant. Accordingly, the InP based quantum dot may not have a reduced level of a FWHM while emitting light of a desired wavelength (e.g., greater than about 470 nm, greater than or equal to about 475 nm, greater than or equal to about 480 nm, and less than or equal to about 550 nm). In addition, the core including indium and phosphorus may be susceptible to surface oxidation and a quantum dot including the same may have an increased FWHM when including a shell, e.g., a shell is coated on a core of the quantum dot, and thus it may be difficult to achieve a quantum efficiency of a desired level together with a desired FWHM. Accordingly, quantum dots including a Group III-V compound (e.g., an InP based core) may not show, e.g., exhibit, a desirable FWHM even if they have a desirable particle distribution within one monolayer thereof.

The present inventors have found that as a cadmium free quantum dot, a ZnTeSe based nanocrystal particle may control a wavelength difference taking into consideration a particle distribution at a limited level, being capable of showing a reduced level of a FWHM. Provided is a quantum dot structure including a ZnTeSe based core exhibiting desirable luminous properties.

A quantum dot (or quantum dots) according to an embodiment is a cadmium free quantum dot not including cadmium. The quantum dot(s) of an embodiment may not include a toxic heavy metal such as lead or the like. A maximum luminescent peak of the quantum dot is present in a wavelength range of greater than about 470 nm and a quantum efficiency thereof is greater than or equal to about 10%. The quantum dot of an embodiment has a core-shell structure. In an embodiment, the quantum dot(s) includes (or include) a core including a first semiconductor nanocrystal material; and a semiconductor nanocrystal shell disposed on (at least a portion of) the core (or a surface thereof). In an embodiment, "not including the cadmium (or a certain element)" may refer to the case where a concentration of the cadmium (or the certain element) may be less than or equal to about 50 ppm, less than or equal to about 10 ppm, or almost zero.

The cadmium free quantum dot may include tellurium in an amount of a predetermined range. An amount of components included in the quantum dot may be determined through an appropriate analysis tool (e.g., an inductively coupled plasma atomic emission spectroscopy (ICP-AES), an X-ray photoelectron spectroscopy (XPS), or the like).

In a cadmium free quantum dot of an embodiment, a mole ratio of tellurium with respect to selenium (Te:Se) may be greater than about 0.05:1, for example, greater than or equal to about 0.055:1, greater than or equal to about 0.06:1, greater than or equal to about 0.065:1, or greater than or equal to about 0.07:1. In a cadmium free quantum dot of an embodiment, a mole ratio of tellurium with respect to selenium (Te:Se) may be greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.45:1, greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.85:1, greater than or equal to about 0.9:1, or greater than or equal to about 0.95:1. In the quantum dot, a mole ratio of tellurium with respect to selenium may be greater than about 1:1. In an embodiment, a mole ratio of tellurium with respect to selenium may be greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, greater than or equal to about 2.2:1, greater than or equal to about 2.3:1, greater than or equal to about 2.4:1, greater than or equal to about 2.5:1, greater than or equal to about 2.6:1, greater than or equal to about 2.7:1, greater than or equal to about 2.8:1, greater than or equal to about 2.9:1, or greater than or equal to about 3:1.

In an embodiment, a mole ratio of tellurium with respect to selenium may be less than or equal to about 4:1, less than or equal to about 3.9:1, less than or equal to about 3.8:1, less than or equal to about 3.7:1, less than or equal to about 3.6:1, less than or equal to about 3.5:1, less than or equal to about 3.4:1, less than or equal to about 3.3:1, less than or equal to about 3.2:1, less than or equal to about 3.1:1, less than or equal to about 3:1, less than or equal to about 2.9:1, less than or equal to about 2.8:1, less than or equal to about 2.7:1, less than or equal to about 2.6:1, less than or equal to about 2.5:1, or less than or equal to about 2.4:1.

In a quantum dot of an embodiment, a mole ratio of tellurium with respect to zinc (Te:Zn) may be greater than about 0.03:1. In a quantum dot an embodiment, a mole ratio of tellurium with respect to zinc (Te:Zn) may be greater than or equal to about 0.1:1, greater than or equal to about 0.13:1, greater than or equal to about 0.15:1, greater than or equal to about 0.17:1, greater than or equal to about 0.19:1, greater than or equal to about 0.2:1, greater than or equal to about 0.21:1, greater than or equal to about 0.23:1, or greater than or equal to about 0.25:1. In a quantum dot of an embodiment, a mole ratio of tellurium with respect to zinc (Te:Zn) may be less than about 1:1, for example, less than or equal to about 0.9:1, less than or equal to about 0.8:1, less than or equal to about 0.7:1, less than or equal to about 0.6:1, less than or equal to about 0.5:1, or less than or equal to about 0.4:1 (for example, when being determined by an inductively coupled plasma atomic emission spectroscopy analysis)

A quantum dot of an embodiment may further include sulfur. In this case, a mole ratio of sulfur with respect to zinc may be greater than or equal to about 0.05:1, greater than or equal to about 0.1:1, greater than or equal to about 0.15:1, greater than or equal to about 0.2:1, greater than or equal to about 0.25:1, greater than or equal to about 0.3:1, or greater than or equal to about 0.35:1 and less than or equal to about 0.95:1, less than or equal to about 0.9:1, less than or equal to about 0.85:1, less than or equal to about 0.8:1, less than or equal to about 0.75:1, less than or equal to about 0.7:1, less than or equal to about 0.65:1, or less than or equal to about 0.6:1.

In the quantum dot of an embodiment, the core may include a first semiconductor nanocrystal including zinc, tellurium, and selenium.

The first semiconductor nanocrystal may include $ZnTe_xSe_{1-x}$ (wherein x is greater than or equal to about 0.5, for example, greater than or equal to about 0.51, greater than or equal to about 0.52, greater than or equal to about 0.53, greater than or equal to about 0.54, greater than or equal to about 0.55, greater than or equal to about 0.56, greater than or equal to about 0.57, greater than or equal to about 0.58, greater than or equal to about 0.59, greater than or equal to about 0.6, greater than or equal to about 0.61, greater than or equal to about 0.62, greater than or equal to about 0.63, greater than or equal to about 0.64, greater than or equal to about 0.65, greater than or equal to about 0.66, greater than or equal to about 0.67, greater than or equal to about 0.68, greater than or equal to about 0.69, greater than or equal to about 0.70, greater than or equal to about 0.71, greater than or equal to about 0.72, greater than or equal to about 0.73, greater than or equal to about 0.74, or greater than or equal to about 0.75 and less than or equal to about 0.9, less than or equal to about 0.89, less than or equal to about 0.88, less than or equal to about 0.87, less than or equal to about 0.86, less than or equal to about 0.85, less than or equal to about 0.84, less than or equal to about 0.83, less than or equal to about 0.82, or less than or equal to about 0.8).

In the quantum dot, or the core (or the first semiconductor nanocrystal) an amount of tellurium may be greater than that of selenium.

In an embodiment, a mole ratio of selenium with respect to tellurium (Se:Te) may be greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.5:1, or greater than or equal to about 0.55:1, and less than or equal to about 4.5:1, less than or equal to about 4:1, less than or equal to about 3.5:1, less than or equal to about 3:1, less than or equal to about 2.5:1, less than or equal to about 2:1, less than or equal to about 1.5:1, less than or equal to about 1:1, less than or equal to about 0.9:1, less than or equal to about 0.8:1, less than or equal to about 0.7:1, less than or equal to about 0.6:1, less than or equal to about 0.5:1, or less than or equal to about 0.45:1.

The quantum dot may not include manganese, copper, or a combination thereof. The quantum dot may not include a Group III-V compound (e.g., an indium phosphide, a gallium phosphide, or the like). The Group III-V compound may include In, Ga, or a combination thereof.

The quantum dot of an embodiment may further include aluminum, lithium, or a combination thereof (hereinafter, also referred to as a third metal) for example in the core, the semiconductor nanocrystal shell, or a combination thereof. In an embodiment, the semiconductor nanocrystal shell may not include aluminum, lithium, or a combination thereof.

In quantum dot (s) of an embodiment, a mole ratio of aluminum, lithium, or a combination thereof with respect to tellurium may be greater than or equal to about 0.01:1, for example, greater than or equal to about 0.02:1, greater than or equal to about 0.03:1, greater than or equal to about 0.04:1, greater than or equal to about 0.05:1, greater than or equal to about 0.06:1, greater than or equal to about 0.07:1, greater than or equal to about 0.08:1, greater than or equal to about 0.09:1, greater than or equal to about 0.1:1, greater than or equal to about 0.11:1, greater than or equal to about 0.12:1, greater than or equal to about 0.13:1, greater than or equal to about 0.14:1, greater than or equal to about 0.15:1, greater than or equal to about 0.16:1, greater than or equal to about 0.17:1, greater than or equal to about 0.18:1, greater than or equal to about 0.19:1, greater than or equal to about 0.2:1, greater than or equal to about 0.21:1, greater than or equal to about 0.22:1, greater than or equal to about 0.23:1, greater than or equal to about 0.24:1, greater than or equal to about 0.25:1, greater than or equal to about 0.26:1, greater than or equal to about 0.27:1, greater than or equal to about 0.28:1, greater than or equal to about 0.29:1, greater than or equal to about 0.3:1, greater than or equal to about 0.31:1, greater than or equal to about 0.32:1, greater than or equal to about 0.33:1, greater than or equal to about 0.34:1, greater than or equal to about 0.35:1, greater than or equal to about 0.36:1, greater than or equal to about 0.37:1, greater than or equal to about 0.38:1, greater than or equal to about 0.39:1, greater than or equal to about 0.4:1, greater than or equal to about 0.41:1, greater than or equal to about 0.42:1, greater than or equal to about 0.43:1, greater than or equal to about 0.44:1, greater than or equal to about 0.45:1, greater than or equal to about 0.46:1, greater than or equal to about 0.47:1, greater than or equal to about 0.48:1, greater than or equal to about 0.49:1, or greater than or equal to about 0.50:1.

In quantum dot (s) of an embodiment, a mole ratio of aluminum, lithium, or a combination thereof with respect to tellurium may be less than or equal to about 1.5:1, less than or equal to about 1:1, less than or equal to about 0.9:1, less than or equal to about 0.85:1, less than or equal to about 0.8:1, less than or equal to about 0.75:1, less than or equal to about 0.7:1, less than or equal to about 0.65:1, less than or equal to about 0.6:1, or less than or equal to about 0.55:1.

The semiconductor nanocrystal shell may include zinc; and at least one of selenium (Se) and sulfur (S). (e.g., sulfur, selenium, or a combination thereof). The semiconductor nanocrystal shell may be ZnSe, ZnS, ZnSeS, or a combination thereof.

The semiconductor nanocrystal shell may be a multi-layered shell including a plurality of layers. In the plurality of layers for the shell, adjacent layers may have semiconductor nanocrystal material of different compositions. The multi-layered shell may include a first layer disposed directly on the core and a second layer disposed on or over the first layer. The first layer may include a second semiconductor nanocrystal. The second layer may include a third semiconductor nanocrystal having a composition different from the second semiconductor nanocrystal. The second layer may be the outermost layer of the quantum dot. The second semiconductor nanocrystal may include zinc, selenium, and optionally sulfur. The second semiconductor nanocrystal may not include sulfur. The third semiconductor nanocrystal may include zinc and sulfur. The third semiconductor nanocrystal may not include selenium.

In a multi-layered shell, a thickness of each layer may be selected appropriately. The thickness of the layer may be greater than or equal to about 1 monolayer (ML), for example, greater than or equal to about 2 ML, greater than or equal to about 3 ML, greater than or equal to about 4 ML, greater than or equal to about 5 ML and less than or equal to about 10 ML, for example, less than or equal to about 9 ML, less than or equal to about 8 ML, less than or equal to about 7 ML, less than or equal to about 6 ML, or less than or equal to about 5 ML. The thickness of each layer in the multi-layered shell may be selected taking into consideration a desired composition of a final quantum dot.

In an embodiment, the quantum dot may include a ZnSe layer, a ZnSeS layer, a ZnS layer, or a combination thereof, each of which may be disposed directly on the core. An outermost layer of the quantum dot may include (or consist of) ZnS.

In an embodiment, the shell or each of the layers in the multi-layered shell may include a gradient alloy having a composition varying in a direction of a radius, e.g., a radial direction from the core toward an outermost surface of the quantum dot. In an embodiment, an amount of the sulfur in the semiconductor nanocrystal shell may increase toward a surface of the quantum dot. For example, in the shell, the amount of the sulfur may increase in a direction away from the core, e.g., in a radial direction from the core toward an outermost surface of the quantum dot.

The quantum dot of an embodiment may show a cubic Zinc Blende crystalline structure for example when analyzed by an X-ray diffraction. Diffraction peaks of the (cadmium free) quantum dot may be indexed to the cubic structure in agreement with the Joint Committee on Powder Diffraction Standard cards.

The (cadmium free) quantum dot(s) (or a population thereof) may have a particle (average) size of greater than or equal to about 2 nm, greater than or equal to about 3 nm, greater than or equal to about 4 nm, greater than or equal to about 5 nm, greater than or equal to about 6 nm, greater than or equal to about 7 nm, or greater than or equal to about 8 nm. A size (or an average size) of the cadmium free quantum dot (or a population thereof) may be less than or equal to about 50 nm, for example, less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, or less than or equal to about 10 nm. As used herein, the size of the quantum dot may refer to a diameter or an equivalent diameter obtained from a two-dimensional image of an electron microscopy analysis (e.g., under an assumption of a circle).

In the quantum dot of an embodiment, a size (or an average size) of the core(s) may be greater than or equal to about 1 nm, for example, greater than or equal to about 2 nm, greater than or equal to about 3 nm or greater than or equal to about 3.5 nm. A size (or an average size) of the core(s) may be less than or equal to about 5 nm, for example, less than or equal to about 4 nm.

The quantum dot(s) may constitute a population of quantum dots. The population of the aforementioned quantum dots may have a standard deviation of sizes that is less than or equal to about 18%, less than or equal to about 17%, less than or equal to about 16%, less than or equal to about 15%, less than or equal to about 14%, less than or equal to about 13%, less than or equal to about 12%, or less than or equal to about 11% of an average size of the quantum dots. The population of the aforementioned quantum dots may have a standard deviation of sizes that is greater than or equal to about 8%, greater than or equal to about 9%, or greater than or equal to about 10%, of an average size of the quantum dots.

A quantum dot of an embodiment is based on a composition of Zn, Te, and Se and has the foregoing features, e.g., having a relatively wide bandgap and a relatively narrow, e.g., small, Bohr radius, e.g., compared to a cadmium based quantum dot or a Group III-V compound (e.g., InP) based quantum dot. Without wishing to be bound by any theory, in the case of the aforementioned quantum dot of an embodiment, it is understood that a variable breadth of a bandgap of a quantum dot of an embodiment versus a change in a size thereof can be relatively smaller than that of a cadmium based quantum dot or a Group III-V compound (e.g., InP) based quantum dot. Thus, it is believed that in the case of the quantum dot of an embodiment, a size range enabling the quantum dot to have a green light emitting bandgap can be wider than size ranges enabling a cadmium based quantum dot and a Group III-V compound (e.g., InP) based quantum dot to have a green light emitting bandgap, and a cadmium free quantum dot of an embodiment may have a narrower FWHM than a cadmium based quantum dot or a Group III-V compound (e.g., InP) based quantum dot. Conventional QDs including ZnTeSe that emit a green light may have a luminous efficiency below about 1%. Provided is a quantum dot including a ZnTeSe alloy based core and emitting light of a wavelength of greater than about 470 at a predetermined efficiency, for example, a luminous efficiency of greater than or equal to about 10%.

Surprisingly, the present inventors have found that by adopting a method that will be described in detail below, uniformity and roundness of the ZnTeSe core (or a population thereof) may be greatly improved and thus when a shell of ZnSe, ZnSeS, ZnS, or ZnSe/ZnS is coated on the ZnTeSe core having the foregoing features, a resulting quantum dot may exhibit greatly enhanced, e.g., improved, luminous efficiency.

In an embodiment, an ultraviolet-visible (UV-Vis) absorption spectrum of the (core or core-shell) quantum dot may include a valley that may be relatively clearly noticed. As used herein, the term "the valley" of the UV-Vis absorption spectrum refers to a portion where a slope of a tangent line of a UV-Vis absorption spectrum curve changes from a negative value to a positive value, as a wavelength increases. The valley may exist near or adjacent to the first absorption peak.

The "first absorption peak" refers to a main excitonic peak appearing first from the longest wavelength region of a UV-vis absorption spectrum of a quantum dot (i.e., appearing in the lowest energy region in the UV-Vis absorption spectrum).

In a UV-vis absorption spectrum, the quantum dot of an embodiment may have a valley that is adjacent to the first absorption peak or in a range of greater than or equal to about 450 nm (or greater than or equal to about 440 nm, greater than or equal to about 430 nm, or greater than or equal to about 420 nm, or greater than or equal to about 410 nm, or greater than or equal to about 400 nm) up to a wavelength of the first absorption peak.

In a UV-vis absorption spectrum of the quantum dot of an embodiment, a depth of the valley (e.g., adjacent to the first absorption peak) (hereinafter, referred to as a valley depth (VD)) may be defined by the following equation:

$$1-(Abs_{valley}/Abs_{first})=VD$$

wherein, $Abs_{first}$ is an absorption intensity at a wavelength of the first absorption peak and $Abs_{valley}$ is an absorption intensity at a lowest point of the valley.

The quantum dot of an embodiment may exhibit a valley depth of at least a predetermined value. In the UV-vis absorption spectrum of the quantum dot of an embodiment, the valley or the lowest point thereof may be appeared at a wavelength lower than the first absorption peak wavelength. In the UV-vis absorption spectrum of the quantum dot, the intensity of the first absorption peak may be greater than the intensity at the lowest point of the valley adjacent thereto.

In the quantum dot of an embodiment, the valley depth defined above may be greater than or equal to about 0.01, for example, greater than or equal to about 0.02, greater than or equal to about 0.03, greater than or equal to about 0.04, greater than or equal to about 0.05, greater than or equal to about 0.06, greater than or equal to about 0.07, greater than or equal to about 0.08, greater than or equal to about 0.09, or greater than or equal to about 0.1.

The first absorption peak of the quantum dot may be present in a wavelength range of greater than or equal to about 410 nm, for example, greater than or equal to about 420 nm, greater than or equal to about 430 nm, greater than or equal to about 440 nm, greater than or equal to about 450 nm, greater than or equal to about 460 nm, greater than or equal to about 465 nm, greater than or equal to about 470 nm, greater than or equal to about 475 nm, greater than or equal to about 480 nm.

The lowest point of the valley of the quantum dot may be present in a wavelength range of greater than or equal to about 410 nm, for example, greater than or equal to about 420 nm, greater than or equal to about 430 nm, greater than or equal to about 440 nm, greater than or equal to about 450 nm, greater than or equal to about 460 nm, greater than or equal to about 465 nm, greater than or equal to about 470 nm, greater than or equal to about 475 nm, greater than or equal to about 480 nm.

The first absorption peak of the quantum dot may be present in a wavelength range of less than or equal to about 510 nm, less than or equal to about 505 nm, less than or equal to about 500 nm, less than or equal to about 495 nm, less than or equal to about 490 nm, less than or equal to about 485 nm, less than or equal to about 480 nm, less than or equal to about 475 nm, less than or equal to about 465 nm, less than or equal to about 460 nm, less than or equal to about 455 nm, less than or equal to about 450 nm, or less than or equal to about 445 nm.

The lowest point of the valley of the quantum dot may be present in a wavelength range of less than or equal to about 510 nm, less than or equal to about 505 nm, less than or equal to about 500 nm, less than or equal to about 495 nm, less than or equal to about 490 nm, less than or equal to about 485 nm, less than or equal to about 480 nm, less than or equal to about 475 nm, less than or equal to about 465 nm, less than or equal to about 460 nm, less than or equal to about 455 nm, less than or equal to about 450 nm, less than or equal to about 445 nm.

In comparison with other quantum dots based on Zn, Te, and Se, the quantum dots of an embodiment may emit green light with an improved quantum efficiency, for example, that is greater than or equal to about 10%. The quantum dots of an embodiment may emit light at a quantum efficiency of greater than or equal to about 11%, greater than or equal to about 12%, greater than or equal to about 13%, greater than or equal to about 14%, greater than or equal to about 15%, greater than or equal to about 16%, greater than or equal to about 17%, greater than or equal to about 18%, greater than or equal to about 19%, greater than or equal to about 20%, greater than or equal to about 21%, greater than or equal to about 22%, greater than or equal to about 23%, greater than or equal to about 24%, greater than or equal to about 25%, greater than or equal to about 26%, greater than or equal to about 27%, greater than or equal to about 28%, greater than or equal to about 29%, or greater than or equal to about 30%.

A maximum photoluminescent peak wavelength of the quantum dot may be present in a range of greater than about 470 nm, for example, 471 nm, greater than or equal to about 472 nm, greater than or equal to about 473 nm, greater than or equal to about 474 nm, greater than or equal to about 475 nm, greater than or equal to about 476 nm, greater than or equal to about 477 nm, greater than or equal to about 478 nm, greater than or equal to about 479 nm, greater than or equal to about 480 nm, greater than or equal to about 485 nm, greater than or equal to about 490 nm, greater than or equal to about 495 nm, greater than or equal to about 500 nm, greater than or equal to about 505 nm, greater than or equal to about 510 nm, greater than or equal to about 515 nm, or greater than or equal to about 520 nm. The quantum dot may have a maximum PL peak wavelength of less than or equal to about 550 nm, for example, less than or equal to about 540 nm, or less than or equal to about 535 nm. The quantum dot of an embodiment may emit green light. The green light may have a maximum luminescent peak wavelength of from about 515 nm to about 535 nm.

The (cadmium free) quantum dot of an embodiment may have a FWHM of less than about 50 nm, less than or equal to about 45 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, less than or equal to about 28 nm, less than or equal to about 27 nm, less than or equal to about 26 nm, or less than or equal to about 25 nm.

The quantum dot may include an organic ligand e.g., on a surface thereof. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, $R_2POOH$, a polymeric organic ligand, or a combination thereof wherein R and R' are the same or different, and are independently a C1 to C40 (e.g., C3 to C30 or C6 to C24) substituted or unsubstituted aliphatic hydrocarbon (alkyl, alkenyl, or alkynyl) group or a C6 to C40 substituted or unsubstituted aromatic hydrocarbon group, or a combination thereof. Two or more different organic ligand may be used.

The organic ligand may coordinate to, e.g., be bound to, the surface of the quantum dot, helping the nanocrystal to be well dispersed in the solution. Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, or a substituted or unsubstituted octylphosphine (e.g., trioctylphosphine (TOP)); a phosphine oxide such as a substituted or unsubstituted methyl phosphine oxide (e.g., trimethyl phosphine oxide, methyldiphenyl phosphine oxide, etc.), a substituted or unsubstituted ethyl phosphine oxide (e.g., triethyl phosphine oxide, ethyldiphenyl phosphine oxide, etc.), a substituted or unsubstituted propyl phosphine oxide, a substituted or unsubstituted butyl phosphine oxide, or a substituted or unsubstituted octyl phosphine oxide (e.g., trioctylphosphine oxide (TOPO)); diphenyl phosphine, diphenyl phosphine oxide, triphenyl phosphine, or triphenyl phosphine oxide; a mono- or di(C5 to C20 alkyl)phosphinic acid such as a mono- or dihexylphosphinic acid, a mono- or dioctylphosphinic acid, a mono- or di(dodecyl)phosphinic acid, a mono- or di(tetradecyl)phosphinic acid, a mono- or di(hexadecyl) phosphinic acid, a mono- or di(octadecyl)phosphinic acid, or a combination thereof; a C5 to C20 alkylphosphinic acid, a C5 to C20 alkylphosphonic acid such as hexylphosphonic acid, octylphosphonic acid, dodecylphosphonic acid, tetradecylphosphonic acid, hexadecylphosphonic acid, octadecylphosphonic acid, or a combination thereof; and the like, but are not limited thereto. Two or more different organic ligand compound may be used.

In an embodiment, the organic ligand compound may be a combination of RCOOH and an amine (e.g., $RNH_2$, $R_2NH$, $R_3N$, or a combination thereof). The organic ligand may not include an organic compound having a thiol moiety and an amino group, a carboxylic acid group, or a combination thereof.

The organic ligand may not include an organic compound having a thiol moiety and an amino group, a carboxylic acid group, or a combination thereof. The organic ligand may not include glutathione compound.

The quantum dot may be water-insoluble.

When being dispersed in water, the quantum dot may show an average particle size of greater than or equal to about 300 nm as determined by a dynamic light scattering (DLS) analysis. When being dispersed in an organic solvent (such as toluene, octane, or the like), the quantum dot may be configured to form an organic solution having an average particle size of less than or equal to about 500 nm, less than or equal to about 400 nm, less than or equal to about 300 nm, less than or equal to about 200 nm, less than or equal to about 100 nm, or less than or equal to about 90 nm as determined by a DLS analysis.

In an embodiment, a method of manufacturing the foregoing cadmium free quantum dot(s) includes preparing a core including a first semiconductor nanocrystal including zinc, tellurium, and selenium;

in a third organic solvent, in the presence of the core particle and a third organic ligand, reacting a zinc precursor with a non-metal precursor of a selenium precursor, a sulfur precursor, or a combination thereof at a shell formation temperature to form a semiconductor nanocrystal shell including zinc and selenium, sulfur, or a combination thereof on a surface of the core, wherein the preparing of the core includes preparing a zinc precursor organic solution including a zinc precursor and a first organic ligand in a first organic solvent; and while heating the zinc precursor organic solution at a first reaction temperature, adding thereto a selenium precursor, a tellurium precursor, a hydride compound, and a, e.g., at least one, second organic ligand, and wherein the tellurium precursor includes tellurium dispersed in a second organic solvent and a concentration of the tellurium in the tellurium precursor is greater than about 0.1 M, for example, greater than or equal to about 0.5 M, or greater than or equal to about 1 M.

As explained above, by adopting the foregoing method, the quantum dot of an embodiment including a shell formed on a ZnTeSe core may exhibit an improved light emitting efficiency.

The present inventors have found that using more than a predetermined amount of a Te precursor (e.g., Te/TOP) to synthesize a core may result in a non-uniform particle size distribution of synthesized cores and non-spherical cores. Without wishing to be bound by any theory, a reactivity of the tellurium in a reaction system is related to a quality of the core as prepared. The tellurium precursor may fail to have a sufficiently strong bond between a chalcogen and a solvent (e.g., TOP). For example, at room temperature, a solvent added in a free state (e.g., a free TOP) may form a Te-TOP bond in the precursor, and unlike other chalcogen precursor, the tellurium precursor may have only a weak bond (e.g., a solvation level bond) with a solvent. In a method of an embodiment, lowering a ratio of the solvent with respect to the tellurium (i.e., increasing the concentration of the tellurium in the precursor) may increase a reactivity of the tellurium. In combination with using the hydride compound and the second organic ligand, such an increased reactivity of the tellurium may result in an increase of a valley depth of the core. The increased valley depth of the core may indicate that the given cores have improved quality (such as a uniform surface and a uniform size distribution). In addition to this, increasing a concentration of a metal precursor in a reaction system may cause a surface coverage of the organic ligand, and the resulting quantum dot may show a further improved valley depth. Therefore, a core prepared in a method of an embodiment may include an increased amount of organic materials for example, as determined by a Thermal Gravimetric Analysis.

Accordingly, a core prepared according to a method of an embodiment may have improved uniformity of a size distribution together with an improved roundness and more even surface coverage. Without wishing to be bound by any theory, when a shell is formed on the foregoing core, a face selectivity for the shell formation may decrease and thereby a coating with an improved quality may be accomplished. Therefore, a resulting quantum dot of a core-shell structure including a ZnTeSe based core may exhibit enhanced, e.g., improved, luminous properties (e.g., improved quantum efficiency and the improved FWHM).

Details for the composition of the quantum dots and details for the core are the same as set forth above.

The synthesized core may be separated from the reaction system (e.g., via the addition of the non-solvent, which will be described below).

In an embodiment, prior to being added to the zinc precursor organic solution, the selenium precursor, the tellurium precursor, the metal hydride compound, and the second organic ligand may be mixed together at a temperature of less than about 80° C., for example, less than or equal to about 75° C., less than or equal to about 70° C., less than or equal to about 65° C., less than or equal to about 60° C., less than or equal to about 55° C., less than or equal to about 50° C., or less than or equal to about 45° C. to form a single stock solution.

The second organic ligand may be an aliphatic organic amine compound or a combination thereof. The metal hydride compound may include lithium, aluminum, or a combination thereof. The metal hydride compound may include an aluminum hydride compound, a lithium hydride compound, or a combination thereof. The metal hydride compound may include an organic metal hydride compound (for example, having a, e.g., at least one, hydrocarbon group), an inorganic metal hydride compound, or a combination thereof. The metal hydride compound may include an alkyl lithium hydride (e.g., dialkyl lithium borohydride where each alkyl group may have from 1 to 6 carbon atoms), a lithium aluminum hydride compound, or a combination thereof.

In the preparation of the core, a mole ratio of the tellurium with respect to the selenium introduced into the reaction system (Te:Se) may be greater than about 0.25:1, greater than or equal to about 0.3:1, greater than or equal to about 0.4:1, greater than or equal to about 0.5:1, greater than or equal to about 0.7:1, greater than or equal to about 0.9:1, greater than or equal to about 1:1, greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, or greater than or equal to about 2.5:1.

In the preparation of the core, a mole ratio of the tellurium with respect to the selenium introduced into the reaction system (Te:Se) may be less than or equal to about 10:1, less than or equal to about 9:1, less than or equal to about 8:1, less than or equal to about 7:1, less than or equal to about 6:1, less than or equal to about 5:1, less than or equal to about 4:1, less than or equal to about 3:1, less than or equal to about 2:1, or less than or equal to about 1.5:1.

In the preparation of the core, a mole ratio of the zinc with respect to the tellurium may be selected appropriately taking into consideration a desired composition, the precursor(s), or the like. According to an embodiment, in the preparation of the core, an amount of the zinc with respect to one mole of the tellurium may be greater than or equal to about 1 moles, greater than or equal to about 2 moles, greater than or equal to about 3 moles, greater than or equal to about 4 moles, or greater than or equal to about 5 moles. According to an embodiment, in the preparation of the core, an amount of the zinc with respect to one mole of the tellurium may be, less than or equal to about 20 moles, less than or equal to about 15 moles, less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, or less than or equal to about 2 moles.

In an embodiment, formation of the shell may be carried out by heating (or vacuum treating) a shell metal precursor and an organic ligand in an organic solvent at a predetermined temperature (e.g., at a temperature of greater than or equal to about 100° C., for example, greater than or equal to about 120° C.) under vacuum, changing an atmosphere of a reaction system into an inert gas and heating the same at a predetermined reaction temperature. The core and a non-metal shell precursor (e.g., sulfur and selenium precursors) may be added into the (heated) reaction system to carry out a reaction. The shell precursor(s) may be injected at the same time or sequentially during the reaction taking into consideration a desired shell composition.

The shell having a desired composition (e.g., a gradient composition or a multi-layered composition) may be formed.

In an embodiment, a zinc precursor may react with a selenium precursor to form a first layer including zinc and selenium and then reacted with a sulfur precursor to form a second layer including zinc and sulfur.

In an embodiment, the semiconductor nanocrystal shell formation may include reacting the zinc precursor and the selenium precursor. The semiconductor nanocrystal shell formation may include reacting the zinc precursor and the sulfur precursor. The semiconductor nanocrystal shell formation may include reacting the zinc precursor with the selenium precursor and then reacting the zinc precursor with the sulfur precursor.

In the foregoing method, the zinc precursor may include a Zn powder, ZnO, an alkylated Zn compound (e.g., C2 to C30 alkyl (e.g., dialkyl) zinc such as dimethyl zinc, diethyl zinc), a Zn alkoxide (e.g., a zinc ethoxide), a Zn carboxylate (e.g., a zinc acetate or zinc aliphatic carboxylate, for example, zinc long chain aliphatic carboxylate such as zinc oleate), a Zn nitrate, a Zn perchlorate, a Zn sulfate, a Zn acetylacetonate, a Zn halide (e.g., a zinc chloride), a Zn cyanide, a Zn hydroxide, zinc carbonate, zinc peroxide, or a combination thereof. Examples of the zinc precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The tellurium precursor may include tellurium-trioctylphosphine (Te-TOP), tellurium-tributylphosphine (Te-TBP), tellurium-triphenylphosphine (Te-TPP), tellurium-diphenylphosphine (Te-DPP), or a combination thereof, but is not limited thereto.

The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), sulfur-octadecene (S-ODE), bistrimethylsilyl sulfide, ammonium sulfide, sodium sulfide, or a combination thereof.

The first, second, and/or third organic solvent may be same as or different from each other. The first, second, and/or third organic solvent (hereinafter, simply referred to as an organic solvent) may be a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with a, e.g., at least one (e.g., 1, 2, or 3), C6 to C22 alkyl group, a phosphine oxide (e.g., trioctylphosphine oxide) substituted with a, e.g., at least one (e.g., 1, 2, or 3), C6 to C22 alkyl group, a C12 to C22 aromatic ether such as a phenyl ether or a benzyl ether, or a combination thereof.

The first organic ligand and the second organic ligand may be the same. The first organic ligand and the second organic ligand may be different. Details for the first and the second organic ligands are the same as set forth above about the organic ligand. In an embodiment, the first organic ligand may include a fatty acid (e.g., including a C10 or greater aliphatic hydrocarbon group) and the second organic ligand may include a fatty organic (e.g., primary) amine (e.g., including one C10 or greater aliphatic or aromatic hydrocarbon group), an aromatic phosphine compound, or a combination thereof.

The carbon number of the aliphatic hydrocarbon group may be greater than or equal to about 5, greater than or equal to about 10, greater than or equal to about 15, greater than or equal to about 16, greater than or equal to about 17, greater than or equal to about 18, greater than or equal to about 19, or greater than or equal to about 20; and/or less than or equal to about 50, less than or equal to about 40, or less than or equal to about 30.

Amounts of the first organic ligand and the second organic ligand may be selected taking into consideration types of the organic ligands and types of the precursors.

An amount of the first organic ligand (or an amount of the second ligand) may be, with respect to 1 mole of the zinc precursor, greater than or equal to about 0.1 moles, greater than or equal to about 0.2 moles, greater than or equal to about 0.3 moles, greater than or equal to about 0.4 moles, greater than or equal to about 0.5 moles, greater than or equal to about 0.6 moles, greater than or equal to about 0.7 moles, greater than or equal to about 0.8 moles, greater than or equal to about 0.9 moles, greater than or equal to about 1 moles, greater than or equal to about 2 moles, greater than or equal to about 3 moles, greater than or equal to about 4 moles, or greater than or equal to about 5 moles. An amount of the first organic ligand (or an amount of the second ligand) may be, with respect to 1 mole of the zinc precursor, less than or equal to about 20 moles, less than or equal to about 19 moles, less than or equal to about 18 moles, less than or equal to about 17 moles, less than or equal to about 16 moles, less than or equal to about 15 moles, less than or equal to about 14 moles, less than or equal to about 13 moles, less than or equal to about 12 moles, less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, less than or equal to about 2 moles, or less than or equal to about 1 mole.

A mole ratio between the first organic ligand and the second organic ligand (the first organic ligand:the second organic ligand) may be 1:about 0.1 or greater, 1:about 0.5 or greater, 1:about 0.9 or greater, or 1:about 1 or greater, and/or 1:about 10 or less; 1:about 5 or less, 1:about 2.5 or less, or 1:about 1.5 or less; or a combination thereof.

In an embodiment, the selenium precursor, the tellurium precursor, the metal hydride compound may be injected into the zinc precursor organic solution in a mixed state optionally together with the organic ligand. In an embodiment, the selenium precursor, the tellurium precursor, and the metal hydride compound may be injected into the zinc precursor organic solution sequentially.

The reaction temperature for the core formation may be greater than or equal to about 250° C., greater than or equal to about 260° C., greater than or equal to about 270° C., greater than or equal to about 280° C., greater than or equal to about 290° C., or greater than or equal to about 300° C. The reaction temperature for the core formation may be less than or equal to about 350° C., for example, less than or equal to about 340° C., less than or equal to about 330° C., less than or equal to about 320° C., or less than or equal to about 310° C. The reaction time for the core formation is not particularly limited and may be selected appropriately.

The reaction temperature for the shell formation may be selected appropriately in any suitable range of greater than or equal to about 200° C., for example, greater than or equal to about 210° C., greater than or equal to about 220° C., greater than or equal to about 230° C., greater than or equal to about 240° C., greater than or equal to about 250° C., greater than or equal to about 260° C., greater than or equal to about 270° C., greater than or equal to about 280° C., or greater than or equal to about 290° C. and less than or equal to about 340° C., for example, less than or equal to about 325° C. The reaction time for the shell formation may be selected appropriately in light of a desired shell composition.

In a reaction system for the core formation and a reaction system for the shell formation, an amount of each precursor and a concentration thereof may be selected taking into consideration a desired composition of the core and the shell, a reactivity between the core and shell precursors, or the like. In an embodiment, taking into consideration a desired composition of a final quantum dot (e.g., a ratio between elements such as Zn, S, Se, Te, or a combination thereof), ratios between the precursors may be controlled. The composition of the final quantum dot may be determined by an appropriate analysis tool such as an inductively coupled plasma atomic emission spectroscopy.

After the formation of the core, the shell, or a combination thereof, a non-solvent is added to reaction products and the nanocrystal particles coordinated with, e.g., bound to, the ligand compound may be separated. The non-solvent may be a polar solvent that is miscible with the solvent used in the core formation reaction, shell formation reaction, or a combination thereof and is not capable of dispersing the produced nanocrystals therein. The non-solvent may be selected taking into consideration the solvent used in the reaction and may be for example acetone, ethanol, butanol, isopropanol, ethanediol, water, tetrahydrofuran (THF), dimethylsulfoxide (DMSO), diethyl ether, formaldehyde, acetaldehyde, a solvent having a similar solubility parameter to the foregoing solvents, or a combination thereof. Separation of the nanocrystal particles may involve centrifugation, sedimentation, chromatography, or distillation. The separated nanocrystal particles may be added to a washing (or dispersing) solvent and washed (or dispersed), if desired. Types of the washing (dispersing) solvent are not particularly limited and a solvent having similar solubility parameter to that of the ligand may be used and examples thereof may include hexane, heptane, octane, chloroform, toluene, benzene, or the like.

The core-shell quantum dots of an embodiment may not dispersible in water, the foregoing listed non-solvent, or a combination thereof. The core-shell quantum dots of an embodiment may be water-insoluble. The core-shell quantum dots of an embodiment may be dispersed in the aforementioned organic solvent. In an embodiment, the core-shell quantum dots may be dispersed in a C6 to C40 aliphatic hydrocarbon, a C6 to C40 aromatic hydrocarbon, or a combination thereof.

In an embodiment, a composition includes the aforementioned (e.g., a plurality of) cadmium free quantum dot(s) (hereinafter, may be referred to simply as a quantum dot or quantum dots); and a dispersing agent (e.g., a binder monomer or polymer); a (photo)polymerizable monomer having a, e.g., at least one, carbon-carbon double bond; a (photo) initiator; or a combination thereof. The binder monomer or polymer may include a carboxylic acid group. The composition may further include an organic solvent, a liquid vehicle, or a combination thereof.

The composition according to an embodiment may be prepared by a method including: preparing quantum dot dispersion including the aforementioned quantum dot, the dispersing agent, and the organic solvent; and mixing the quantum dot dispersion with the initiator; the polymerizable monomer (e.g., acryl-based monomer); optionally the thiol compound; optionally the metal oxide particulate, and optionally the additives. Each of the aforementioned components may be mixed sequentially or simultaneously, but mixing orders are not particularly limited.

The composition thus prepared may provide a quantum dot (polymer) composite (e.g., via a radical polymerization). Thus, in an embodiment, a quantum dot (polymer) composite includes a (polymer) matrix; and the aforementioned quantum dot(s) dispersed in the (polymer) matrix. The matrix may include a dispersing agent (e.g., a binder monomer or polymer including a carboxylic acid group), a polymerization product (e.g., an insulating polymer) of an ene compound, i.e., a polymerizable monomer having a carbon-carbon double bond (at least one, for example, at least two, at least three, at least four, or at least five carbon-carbon double bonds), optionally a polymerization product of the polymerizable monomer and a thiol compound including a, e.g., at least one, thiol group (e.g., at a terminal end of the thiol compound), preferably a multi-functional thiol compound including at least two thiol groups (e.g., at a terminal end of the multi-functional thiol compound), a metal oxide particulate(s), or a combination thereof.

In an embodiment, the matrix may include a cross-linked polymer and a dispersing agent (e.g., a carboxylic acid group-containing binder monomer or polymer). In an embodiment, the matrix may not include a conjugated polymer (except for a cardo resin). The cross-linked polymer may include a thiolene resin, a cross-linked poly(meth)acrylate, or a combination thereof. In an embodiment, the cross-linked polymer may be a polymerization product of the ene compound (the polymerizable monomer) and, optionally, the multi-functional thiol compound.

An amount of the quantum dot(s) in the composition (or the composite) may be appropriately adjusted taking into consideration a desirable final use (e.g., a photoluminescent color filter, etc.). In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a total solids content of the composition. The amount of the quantum dot may be less than or equal to about 70 wt %, for example, less than or equal to about 65 wt %, less than or equal to about 60 wt %, less than or equal to about 55 wt %, or less than or equal to about 50 wt %, based on a total solids content of the composition.

The composition according to an embodiment may be used to produce a quantum dot-polymer composite pattern. The composition according to an embodiment may be a quantum dot-containing photoresist composition to which a photolithography method may be applied. The composition according to an embodiment may be an ink composition that may provide a pattern by printing (e.g., a droplet discharge method such as inkjet printing).

In the composition or the composite according to an embodiment, the dispersing agent may be a binder monomer or polymer. The binder monomer or polymer may include a carboxylic acid group.

The binder polymer may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure in which two aromatic rings are bound to a quaternary carbon atom that is a constituent atom of another cyclic moiety in the main chain and including a carboxylic acid group (—COOH) (hereinafter, a cardo binder); or a combination thereof.

The copolymer includes a first repeating unit derived from the first monomer and a second repeating unit derived from the second monomer, and optionally a third repeating unit derived from the third monomer.

Examples of the first monomer may include a carboxylic acid compound including a vinyl ester moiety such as acrylic acid, methacrylic acid, maleic acid, itaconic acid, fumaric acid, 3-butenoic acid, or, but are not limited thereto. One or more first monomers may be used. Examples of the second monomer may be an alkenyl aromatic compound such as styrene, alpha-methyl styrene, vinyl toluene, vinyl benzoate or vinyl benzyl methyl ether; an unsaturated carboxylic acid ester compound such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, vinyl acetate, or phenyl methacrylate; an unsaturated carboxylic acid amino alkyl ester compound such as 2-amino ethyl acrylate, 2-amino ethyl methacrylate, 2-dimethyl amino ethyl acrylate, or 2-dimethyl amino ethyl methacrylate; a maleimide such as N-phenylmaleimide, N-benzylmaleimide, N-alkylmaleimide; an unsaturated carboxylic acid glycidyl ester compound such as glycidyl acrylate or glycidyl methacrylate; a vinyl cyanide compound such as acrylonitrile, methacrylonitrile; or a unsaturated amide compound such as acryl amide or methacryl amide, but are not limited thereto. One or more second monomers may be used. Specific examples of the third monomer may include 2-hydroxy ethyl acrylate, 2-hydroxy ethyl methacrylate, 2-hydroxy butyl acrylate, or 2-hydroxy butyl methacrylate, but are not limited thereto. One or more third monomers may be used.

In the carboxylic acid group-containing polymer (also referred to as a binder or a binder polymer), the content of each of the first repeating unit or the second repeating unit may independently be greater than or equal to about 10 mole percent (mol %), for example, greater than or equal to about 15 mol %, greater than or equal to about 25 mol %, or greater than or equal to about 35 mol %, based on a total number of moles in the carboxylic acid group containing polymer. In the carboxylic acid group containing polymer, an amount of the first repeating unit or the second repeating unit may be less than or equal to about 90 mol %, for example, 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %, based on a total number of moles in the carboxylic acid group containing polymer. In the carboxylic acid group containing polymer, if present, an amount of the third repeating unit may be greater than or equal to about 1 mol %, for example, greater than or equal to about 5 mol %, greater than or equal to about 10 mol %, or greater than or equal to about 15 mol %, based on a total number of moles in the carboxylic acid group containing polymer. In the binder polymer, an amount of the third repeating unit may be less than or equal to about 30 mol %, for example, less than or equal to about 25 mol %, less than or equal to about 20 mol %, less than or equal to about 18 mol %, less than or equal to about 15 mol %, or less than or equal to about 10 mol %, based on a total number of moles in the binder polymer.

The carboxylic acid group-containing polymer may include a multiple aromatic ring-containing polymer. The multiple aromatic ring-containing polymer is known as a cardo binder resin and may commercially available.

The carboxylic acid group-containing polymer may have an acid value of greater than or equal to about 50 milligrams of potassium hydroxide per gram (mg KOH/g). For example, the carboxylic acid group containing polymer may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The acid value of the carboxylic acid group-containing polymer may be for example less than or equal to about 250 mg KOH/g, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto. The binder polymer may have a weight average molecular weight of greater than or equal to about 1,000 grams per mole (g/mol), for example, greater than or equal to about 2,000 g/mol, greater than or equal to about 3,000 g/mol, or greater than or equal to about 5,000 g/mol. The binder polymer may have a weight average molecular weight of less than or equal to about 100,000 g/mol, for example less than or equal to about 50,000 g/mol.

In the composition, an amount of the dispersing agent or the binder (polymer or monomer) may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight of the composition, but is not limited thereto. The amount of the binder polymer may be less than or equal to about 55 wt %, less than or equal to about 45 wt %, less than or equal to about 35 wt %, for example less than or equal to about 33 wt %, or less than or equal to about 30 wt %, based on a total weight of the composition or on a total weight of solids in the composition. The aforementioned amount of the dispersing agent may provide enhanced, e.g., improved, dispersibility of the quantum dots.

In the composition, the polymerizable (e.g., photopolymerizable) monomer including the carbon-carbon double bond may include a (e.g., photopolymerizable) acryl-based monomer. The polymerizable monomer may be a precursor for an insulating polymer. The acryl-based monomer may include alkyl(meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A di(meth)acrylate, bisphenol A epoxy(meth)acrylate, trimethylolpropane tri(meth)acrylate, ethylene glycolmonomethyl ether (meth)acrylate, novolac epoxy (meth)acrylate, dipropylene glycol di(meth)acrylate, tripropylene glycol di(meth)acrylate, propylene glycol di(meth)acrylate, tris(meth)acryloyloxyethyl phosphate, or a combination thereof.

An amount of the polymerizable monomer may be greater than or equal to about 0.5 wt %, for example, greater than or equal to about 1 wt % or greater than or equal to about 2 wt %, based on a total weight of the composition. The amount of the photopolymerizable monomer may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on a total weight of the composition.

The initiator in the composition may be used for polymerization of the monomers. The initiator is a compound accelerating a radical reaction (e.g., radical polymerization of monomer) by producing radical chemical species under a mild condition (e.g., by heat or light). The initiator may be a thermal initiator or a photoinitiator. The initiator is a compound capable of initiating a radical polymerization of the polymerizable acrylic monomer, a thiol compound (which will be described below), or a combination thereof by light. The initiator is not particularly limited. The initiator may be a thermal initiator. The thermal initiator may include azobisisobutyronitrile, benzoyl peroxide, and the like, but is not limited thereto. The initiator may be a photoinitiator. The photoinitiator may include a triazine-based compound, an acetophenone compound, a benzophenone compound, a thioxanthone compound, a benzoin compound, an oxime ester compound, an aminoketone compound, a phosphine or phosphine oxide compound, a carbazole-based compound, a diketone compound, a sulfonium borate-based compound, a diazo-based compound, a biimidazole-based compound, or a combination thereof, but is not limited thereto.

In the composition, an amount of the initiator may be appropriately adjusted taking into consideration the polymerizable monomers and amounts of the polymerizable monomers. In an embodiment, the initiator may be used in an amount range of about 0.01 wt % to about 10 wt %, based on a total weight of the composition, but is not limited thereto.

The composition or the composite may further include a (multi- or mono-functional) thiol compound including at least one (e.g., at least two, three, or four) thiol group(s) (for example, at a terminal end of the (multi- or mono-functional) thiol compound), a metal oxide particulate, or a combination thereof.

The metal oxide particulate may include $TiO_2$, $SiO_2$, $BaTiO_3$, $Ba_2TiO_4$, ZnO, or a combination thereof. In the composition, an amount of the metal oxide particulate may be greater than or equal to about 1 wt % and less than or equal to about 15 wt %, less than or equal to about 10 wt %, or less than or equal to about 5 wt %, based on a total weight of solids in the composition. The metal oxide particulate may have an appropriately selected diameter without a particular limit. The diameter of the metal oxide particulate may be greater than or equal to about 100 nm, for example, greater than or equal to about 150 nm, or greater than or equal to about 200 nm and less than or equal to about 1,000 nm or less than or equal to about 800 nm.

The multi-functional thiol compound may include a compound represented by Chemical Formula 1:

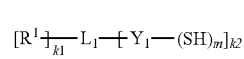

Chemical Formula 1 wherein, in Chemical Formula 1, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group (—NRR', wherein R and R' are independently hydrogen or a C1 to C30 linear or branched alkyl group provided that both are not simultaneously hydrogen); an isocyanate group; a halogen; —ROR' (wherein R is a substituted or unsubstituted C1 to C20 alkylene group and R' is hydrogen or a C1 to C20 linear or branched alkyl group); an acyl halide (—RC(=O)X, wherein R is a substituted or unsubstituted C1 to C20 alkylene group and X is a halogen); —C(=O)OR' (wherein R' is hydrogen or a C1 to C20 linear or branched alkyl group); —CN; —C(=O)NRR' (wherein R and R' are independently hydrogen or a C1 to C20 linear or branched alkyl group); or —C(=O)ONRR' (wherein R and R' are independently hydrogen or a C1 to C20 linear or branched alkyl group), $L_1$ is a carbon atom, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heterocycloalkylene group, or a substituted or unsubstituted C3 to C30 heteroarylene group, wherein a methylene moiety (—$CH_2$—) of the substituted or unsubstituted C1 to C30 alkylene group may be replaced by a sulfonyl moiety (—$SO_2$—), a carbonyl moiety (CO), an ether moiety (—O—), a sulfide moiety (—S—), a sulfoxide moiety (—SO—), an ester moiety (—C(=O)O—), an amide moiety (—O(=O)NR—) (wherein R is hydrogen or a C1 to C10 alkyl group) or a combination thereof, $Y_1$ is a single bond; a substituted or unsubstituted C1 to C30 alkylene group; a substituted or unsubstituted C2 to C30 alkenylene group; a C1 to C30 alkylene group or a C2 to C30 alkenylene group wherein a methylene moiety (—$CH_2$—) is replaced by a sulfonyl moiety (—S(=O)$_2$—), a carbonyl moiety (—C(=O)—), an ether moiety (—O—), a sulfide moiety (—S—), a sulfoxide moiety (—S(=O)—), an ester moiety (—O—(=O)O—), an amide moiety (—C(=O)NR—) (wherein R is hydrogen or a C1 to C10 linear or branched alkyl group), an imine moiety (—NR—)

(wherein R is hydrogen or a C1 to C10 linear or branched alkyl group), or a combination thereof, m is an integer of 1 or greater, k1 is an integer of 0 or 1 or greater, k2 is an integer of 1 or greater, a sum of m and k2 is an integer of 3 or greater, and when $Y_1$ is not a single bond, m does not exceed a valence of $Y_1$, and a sum of k1 and k2 does not exceed a valence of $L_1$.

The multi-functional thiol compound may be a dithiol compound, a trithiol compound, tetrathiol compound, or a combination thereof. For example, the thiol compound may be glycol di-3-mercaptopropionate (e.g., ethylene glycol di-3-mercaptopropionate), glycol dimercapto acetate (e.g., ethylene glycol dimercapto acetate), trimethylolpropane tris (3-mercaptopropionate), pentaerythritol tetrakis (3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the thiol compound may be less than or equal to about 50 wt %, less than or equal to about 45 wt %, less than or equal to about 40 wt %, less than or equal to about 35 wt %, less than or equal to about 30 wt %, less than or equal to about 25 wt %, less than or equal to about 20 wt %, less than or equal to about 15 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight (or total solid content) of the composition. The amount of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, greater than or equal to about 15 wt %, greater than or equal to about 20 wt %, or greater than or equal to about 25 wt %, based on a total weight (or total solid content) of the composition or the composite.

The composition may further include an organic solvent (or a liquid vehicle). The organic solvent is not particularly limited. The organic solvent and an amount of the organic solvent may be appropriately determined by taking into consideration the above main components (i.e., the quantum dot, the dispersing agent, the polymerizable monomer, the initiator, and if used, the thiol compound,) and an additive and an amount of the additive which is described below. The composition may include an organic solvent in a residual amount except for a desired content of the (non-volatile) solid. Examples of the organic solvent (or liquid vehicle) may include ethyl 3-ethoxy propionate, ethylene glycols such as ethylene glycol, diethylene glycol, or polyethylene glycol; glycol ethers such as ethylene glycol monomethyl ether, ethylene glycol monoethyl ether, diethylene glycol monomethyl ether, ethylene glycol diethyl ether, or diethylene glycol dimethyl ether; glycol ether acetates such as ethylene glycol acetate, ethylene glycol monoethyl ether acetate, diethylene glycol monoethyl ether acetate, or diethylene glycol monobutyl ether acetate; propylene glycol; propylene glycol ethers such as propylene glycolmonomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, or dipropylene glycol diethyl ether; propylene glycol ether acetates such as propylene glycolmonomethyl ether acetate, or dipropylene glycol monoethyl ether acetate; amides such as N-methylpyrrolidone, dimethyl formamide, or dimethyl acetamide; ketones such as methylethylketone (MEK), methylisobutylketone (MIBK), or cyclohexanone; petroleums such as toluene, xylene, or solvent naphtha; esters such as ethyl acetate, butyl acetate, or ethyl lactate; ethers such as diethyl ether, dipropyl ether, or dibutyl ether; aliphatic, alicyclic, or aromatic hydrocarbons; or a combination thereof.

If desired, the composition may further include various additives such as a light diffusing agent, a leveling agent, or a coupling agent in addition to the aforementioned components. The amount of the additive is not particularly limited, and may be controlled within an appropriate range wherein the additive may not cause an adverse effect on preparation of the composition and production of the quantum dot-polymer composite and optionally a patterning of the composite.

If present, the additives may be used in an amount of greater than or equal to about 0.1 wt %, for example, greater than or equal to about 0.5 wt %, greater than or equal to about 1 wt %, greater than or equal to about 2 wt %, or greater than or equal to about 5 wt %, based on a total weight of the composition, but is not limited thereto. If used, the content of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt %, based on a total weight of the composition, but is not limited thereto.

The film of the quantum dot-polymer composite or the quantum dot-polymer composite pattern that will be described below may have for example a thickness, less than or equal to about 30 μm, for example less than or equal to about 25 μm, less than or equal to about 20 μm, less than or equal to about 15 μm, less than or equal to about 10 μm, less than or equal to about 8 μm, less than or equal to about 7 μm and greater than or equal to about 2 μm, for example, greater than or equal to about 3 μm, greater than or equal to about 3.5 μm, or greater than or equal to about 4 μm.

In an embodiment, a patterned film includes a repeating section including a first section configured to emit a first light, wherein the first section includes the quantum dot-polymer composite. The repeating section may include a second section emitting a second light having a different maximum (photoluminescence) peak wavelength from the first light, wherein the second section may include a quantum dot-polymer composite. The quantum dot-polymer composite of the second section may include a second quantum dot configured to emit the second light. The second quantum dot may include the aforementioned quantum dot. The first light or the second light may be red light having a maximum photoluminescence peak wavelength which is present between about 600 nm and about 650 nm (e.g., about 620 nm to about 650 nm) or green light having a maximum photoluminescence peak wavelength which is present between about 500 nm and about 550 nm (e.g., about 510 nm to about 540 nm). The patterned film may further include a third section emitting or passing a third light (e.g., blue light) different from the first light and the second light. The third light may have a maximum peak wavelength ranging from about 380 nm to about 480 nm.

An embodiment provides an electronic device including the quantum dot(s). In an embodiment, the electronic device may be a photoluminescent device (e.g., a lighting system such as a quantum dot sheet, a quantum dot rail, a backlight unit, or the like, or a liquid crystal display) or an electroluminescent device (e.g., QD light emitting diode (LED)). In a non-limiting example, the electronic device may include a quantum dot sheet and the foregoing quantum dots may be included in the QD sheet for example, as a semiconductor nanocrystal-polymer composite.

In an embodiment, a display device includes a light emitting element (e.g., photoluminescence element), and the light emitting element includes the aforementioned quantum dot composite. The display device may further include a light source that is configured to provide the light emitting element with incident light.

The incident light may have a (photoluminescence) peak wavelength of greater than or equal to about 440 nm, for example, greater than or equal to about 450 nm and less than or equal to about 500 nm, less than or equal to about 470 nm, or less than or equal to about 460 nm.

In an embodiment, the light emitting element may include a sheet of the quantum dot polymer composite. The display device may further include a liquid crystal panel and the sheet of the quantum dot polymer composite may be disposed between the light source and the liquid crystal panel. FIG. 1 shows an exploded view of a display device. Referring to FIG. 1, the display device may have a structure wherein a reflector, a light guide panel (LGP) and a blue LED light source (Blue-LED), the quantum dot-polymer composite sheet (QD sheet), and various optical films such as a prism, double brightness enhance film (DBEF), and the like are stacked, and a liquid crystal panel is disposed thereon.

In an embodiment, the display device may include a stacked structure including a (e.g., transparent) substrate and a light emitting layer (e.g., a photoluminescent layer) disposed on the substrate as a light emitting element. In the stacked structure, the light emitting layer includes a pattern of the quantum dot polymer composite, and the pattern may include a, e.g., at least one, repeating section configured to emit light of a predetermined wavelength. The pattern of the quantum dot polymer composite may include a first repeating section that may emit a first light, a second repeating section that may emit a second light, or a combination thereof.

The first light and the second light have a different maximum photoluminescence peak wavelength in a photoluminescence spectrum. In an embodiment, the first light may be red light (R) having a maximum photoluminescence peak wavelength of about 600 nm to about 650 nm (e.g., about 620 nm to about 650 nm), the second light may be green light (G) having a maximum photoluminescence peak wavelength of about 500 nm to about 550 nm (e.g., about 510 nm to about 550 nm), or vice versa (i.e., the first light may be a green light and the second light may be a red light).

The substrate may be a substrate including an insulation material. The substrate may include a material of glass; various polymers such as a polyester (e.g., poly(ethylene terephthalate) (PET), poly(ethylene naphthalate) (PEN), or the like), polycarbonate, a poly(C1 to C10 alkyl (meth) acrylate), polyimide, polyamide, or a combination thereof (a copolymer or a mixture thereof); polysiloxane (e.g., PDMS); an inorganic material such as $Al_2O_3$ or ZnO; or a combination thereof, but is not limited thereto. A thickness of the substrate may be desirably selected taking into consideration a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dot.

At least a portion of the substrate may be configured to cut (absorb or reflect) blue light. A layer capable of blocking (e.g., absorbing or reflecting) blue light, also referred to herein as a "blue cut layer" or "blue light absorption layer", may be disposed on a, e.g., at least one, surface of the substrate. For example, the blue cut layer (blue light absorption layer) may include an organic material and a predetermined dye, such as, for example, a yellow dye or a dye capable of absorbing blue light and transmitting green light, red light, or green light and red light.

In an embodiment, a method of producing the stacked structure includes forming a film of the above composition on a substrate;

exposing a selected region of the film to light (e.g., having a wavelength of less than or equal to about 400 nm); and developing the exposed film with an alkali developing solution to obtain a pattern of the quantum dot polymer composite.

The details of the substrate and the composition are the same as described above. The aforementioned composition is coated to have a predetermined thickness on a substrate in an appropriate method of spin coating, slit coating, and the like. If desired, the formed film may be pre-baked (PRB). Conditions (such as a temperature, a duration, and an atmosphere) for the pre-baking may be selected appropriately.

The formed (and optionally, pre-baked) film is exposed to light of a predetermined wavelength (ultraviolet (UV) light) under a mask having a predetermined pattern. The wavelength and the intensity of light may be selected taking into consideration the types and the amounts of the photoinitiator, the types and the amounts of quantum dots, or the like.

The film having the exposed selected area is treated (e.g., sprayed or immersed) with an alkali developing solution, and thereby the unexposed region in the film is dissolved to provide a desired pattern, this process being referred to as development. The obtained pattern may be post-baked (FOB), if desired, for example, at a temperature of about 150° C. to about 230° C. for a predetermined time, for example, greater than or equal to about 10 min or greater than or equal to about 20 min, in order to improve crack resistance and solvent resistance of the pattern, When the quantum dot-polymer composite pattern has a plurality of repeating sections, a quantum dot-polymer composite having a desired pattern may be obtained by preparing a plurality of compositions including a quantum dot (e.g., a red light emitting quantum dot, a green light emitting quantum dot, or optionally, a blue light emitting quantum dot) having desired photoluminescence properties (a photoluminescence peak wavelength and the like) to form each repeating section and repeating the pattern formation process for each of the composition (e.g., twice or more or three times or more) as desired to form a desired pattern of the quantum dot polymer composite.

In an embodiment, an ink composition of an embodiment including the population of the cadmium free quantum dots and the liquid vehicle may be used to form a pattern. For example, a pattern may be formed by depositing the ink composition including a plurality of cadmium free quantum dots, a liquid vehicle, and a monomer on a desired region of a substrate, optionally removing the liquid vehicle, and conducting a polymerization.

For example, the quantum dot-polymer composite may be in the form of a pattern of at least two different repeating color sections (e.g., RGB sections). Such a quantum dot-polymer composite pattern may be used as a photoluminescence-type color filter in a display device.

In an embodiment, the light emitting element may include a stacked structure.

When the display device including the stacked structure includes the light source, the display device may include a plurality of light emitting units respectively corresponding to the first section and the second section, and the light emitting units may include a first electrode and a second electrode facing each other and an electroluminescent layer disposed between the first electrode and the second electrode.

The electroluminescent layer may include an organic light emitting material. For example, each light emitting unit of the light source may include an electroluminescent device (e.g., an organic light emitting diode (OLED)) structured to emit light of a predetermined wavelength (e.g., blue light, green light, or a combination thereof). Structures and materials of the electroluminescent device such as the organic light emitting diode (OLED) are not particularly limited.

Figure 2A:
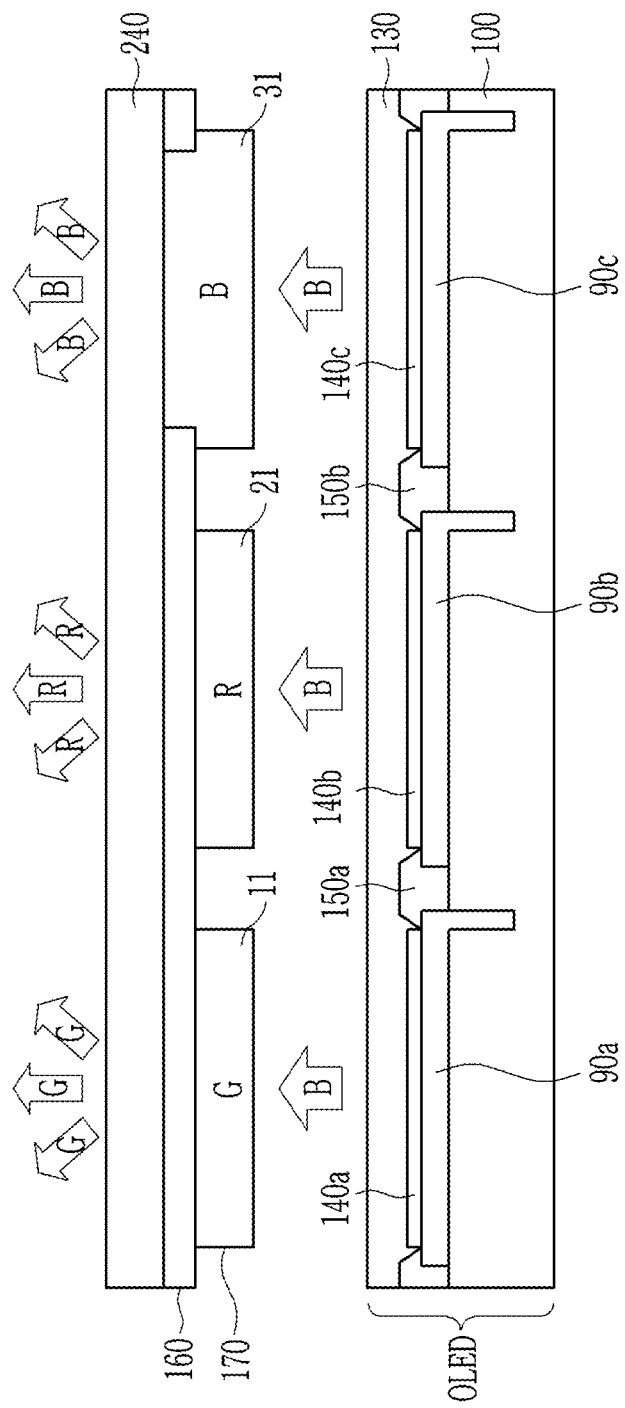
FIG. 2A is a schematic cross-sectional view of a display device according to an embodiment.
Figure 2B:
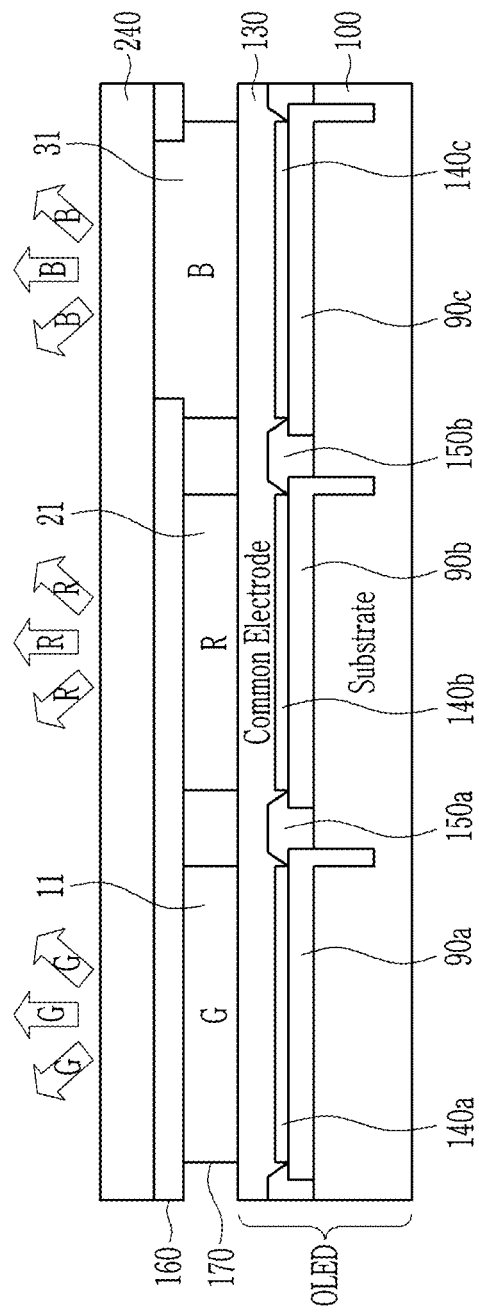
FIG. 2B is a schematic cross-sectional view of a display device according to an embodiment.

FIG. 2A is a schematic cross-sectional view of a display device according to an embodiment and FIG. 2B is a schematic cross-sectional view of a display device according to an embodiment. Referring to FIGS. 2A and 2B, a light source includes an organic light emitting diode (OLED) emitting blue light. The organic light emitting diode OLED may include (at least two, for example, three or more) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c.

A thin film transistor and a substrate may be disposed under the organic light emitting diode (OLED). The pixel areas of the OLED may be disposed corresponding to the first, second, and third sections that will be described in detail below, respectively.

A quantum dot composite pattern (e.g., including a first repeating section including green light emitting quantum dots, a second repeating section including red light emitting quantum dots, or a combination thereof) may be disposed for example as a stacked structure further including a substrate, for example, on (e.g., directly on) or over the light source if present.

The light (e.g., blue light) emitted from the light source may enter the second section 21 and the first section 11 of the pattern 170 to emit (e.g., converted) red light R and green light G, respectively. The blue light B emitted from the light source passes through or transmits from the third section 31.

Over the second section 21 emitting red light, the first section 11 emitting green light, or a combination thereof, an optical element 160 may be disposed. The optical element may be a blue cut layer which cuts (e.g., reflects or absorbs) blue light and optionally green light, or a first optical filter. The blue cut layer or optical element 160 may be disposed on the upper substrate 240. The blue cut layer 160 may be disposed under the upper substrate 240 (e.g., on a bottom surface of the upper substrate 240). The blue cut layer 160 may be disposed between the upper substrate 240 and the quantum dot-polymer composite pattern and over the first section 11 and the second section 21. Details of the blue cut layer are the same as set forth for the first optical filter 310 below.

The display device may be obtained by separately fabricating the stack structure and (e.g., blue light emitting) LED or OLED and then assembling the same. Alternatively, the display device may be obtained by forming a quantum dot-polymer composite pattern directly on the LED or OLED.

In an embodiment, the display device may further include a lower substrate 210, an optical element (e.g., polarizer) 300 disposed below the lower substrate 210, and a liquid crystal layer 220 interposed between the stacked structure and the lower substrate 210. The stacked structure may be disposed in such a manner that a light emitting layer (i.e., the quantum dot-polymer composite pattern) faces the liquid crystal layer. The display device may further include an optical element (e.g., polarizer) 300 between the liquid crystal layer 220 and the light emitting layer. The light source may further include an LED and optionally a light guide panel.

Figure 3:
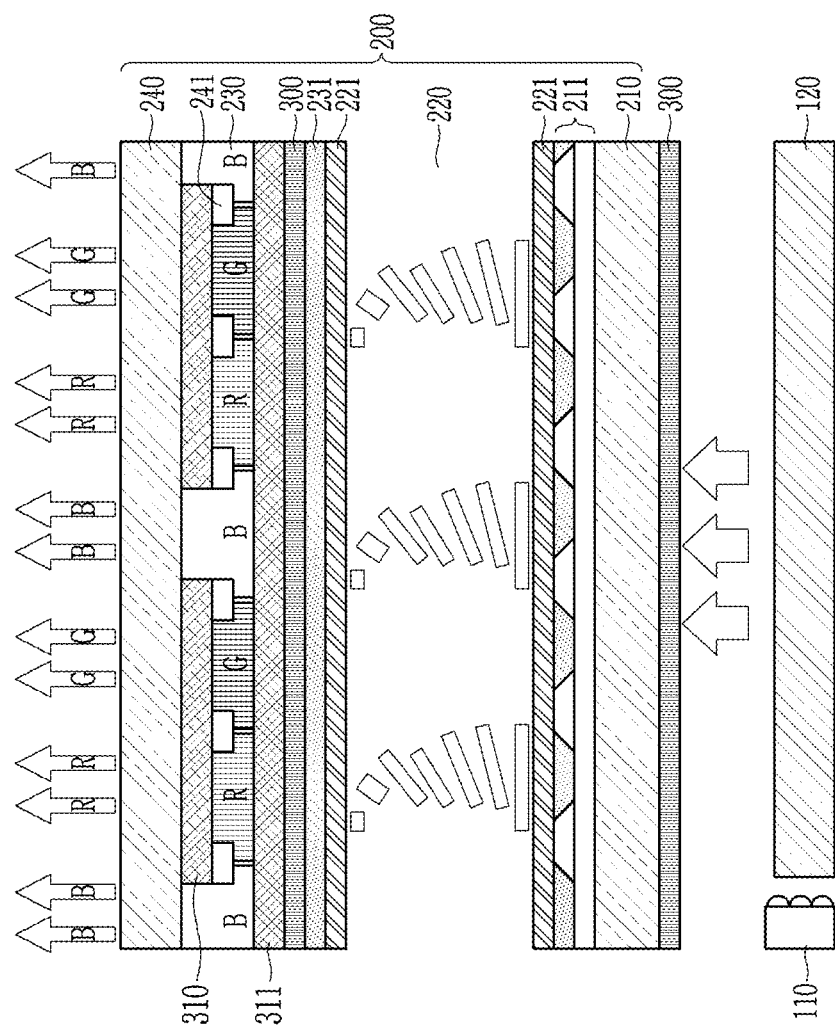
FIG. 3 is a schematic cross-sectional view of a display device according to an embodiment.

Referring to FIG. 3, in an embodiment, the display device may include a liquid crystal panel 200, a lower optical element 300 (e.g., polarizer) disposed on the liquid crystal panel 200, under the liquid crystal panel 200, or a combination thereof and a backlight unit including a blue light emitting light source 110 under a lower optical element 300. The backlight unit may include a light source 110 and a light guide panel 120 (edge type). Alternatively, the backlight unit may be a direct light source without a light guide panel. The liquid crystal panel 200 may include a lower substrate 210, an upper substrate 240, and a liquid crystal layer 220 between the upper and lower substrates, and a light emitting layer (color filter layer) 230 disposed on or under the upper substrate 240. The light emitting layer 230 may include the quantum dot-polymer composite (or a pattern thereof).

A wire plate 211 is provided on an internal surface, for example, on the upper surface of the lower substrate 210. The wire plate 211 may include a plurality of gate wires and data wires that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal layer 220 may include an alignment layer 221 on an upper surface of the liquid crystal layer 220 and on a lower surface of the liquid crystal layer 220, to initially align the liquid crystal material included therein. Details regarding a liquid crystal material, an alignment layer material, a method of forming an alignment layer, a method of forming a liquid crystal layer, a thickness of liquid crystal layer, or the like are not particularly limited.

In an embodiment, an upper optical element or an upper polarizer 300 may be provided between the liquid crystal layer 220 and the upper substrate 240. For example, the upper optical element or upper polarizer 300 may be disposed between the liquid crystal layer 220 (or a common electrode 231) and the light emitting layer (or the quantum dot-polymer composite pattern). A black matrix 241 may be provided under the upper substrate 240 (e.g., on a lower surface thereof). Openings within the black matrix 241 are aligned with (or provided to hide) a gate line, a data line, and a thin film transistor of a wire plate 211 on the lower substrate 210. A second section (R) including a color filter emitting red light, a first section (G) including a color filter emitting green light, a third section (B) including a color filter for emitting or transmitting blue light, or a combination thereof may be disposed in the openings within the black matrix 241 (BM). For example, the black matrix 241 may have a lattice shape. If desired, the light emitting layer may further include a, e.g., at least one, a fourth repeating section. The fourth repeating section may be configured to emit light having a color (e.g., cyan, magenta, yellow, or the like) different from the colors of the light emitted from the first to third sections.

The light emitting layer (color filter layer) 230 may be on a transparent common electrode 231.

If desired, the display device may further include a blue cut filter 310, hereinafter, also referred to as a first optical filter layer 310. The first optical filter layer 310 may be disposed between upper surfaces of the second section (R) and the first section (G) and the lower surface of the upper substrate 240, or on an upper surface of the upper substrate (240). The first optical filter layer 310 may include a sheet having openings that correspond to the third section (B) (e.g., a pixel area showing, e.g., emitting, a blue color) and may be formed on portions corresponding to the first and second sections (G, R). The first optical filter layer 310 may be formed as a single body structure over the portions of the light emitting layer 230 corresponding to the first and second sections (G, R), and which are other than the portions overlapping the third section, but is not limited thereto. Alternatively, at least two first optical filter layers may be spaced apart from each other and may be disposed over each of the portions overlapping the first and the second sections, respectively.

For example, the first optical filter layer may block light having a predetermined wavelength range in the visible light range and may transmit light having another wavelength range. For example, the first optical filter layer may block blue light and transmit light other than blue light. For example, the first optical filter layer may transmit green light, red light, or yellow light (e.g., the mixed light of the green light and the red light).

The first optical filter layer may include a polymer thin film including a dye that absorbs light having a specific wavelength, i.e., the wavelength to be blocked, a pigment that absorbs light having a specific wavelength, i.e., the wavelength to be blocked, or a combination thereof. The first optical filter layer may block at least 80%, at least 90%, or at least 95% of blue light having a wavelength of less than or equal to about 480 nm. With respect to the visible light having other wavelengths, the first optical filter layer may have a light transmittance of greater than or equal to about 70%, for example, greater than or equal to about 80%, greater than or equal to about 90%, or up to 100%.

The first optical filter layer may absorb and substantially block blue light having a wavelength of less than or equal to about 500 nm, and for example, may selectively transmit green light or red light. In this case, at least two first optical filter layers may be spaced apart and disposed on each of the portions overlapping the first and second sections, respectively. For example, the first optical filter layer selectively transmitting red light may be disposed on the portion overlapping the section emitting red light and the first optical filter layer selectively transmitting green light may be disposed on the portion overlapping the section emitting green light.

In an embodiment, the first optical filter layer may include a first region, a second region, or a combination thereof. The first region of the first optical filter layer blocks (e.g., absorbs) blue light and red light and transmits light having a wavelength of a predetermined range, e.g., a wavelength greater than or equal to about 500 nm, greater than or equal to about 510 nm, or greater than or equal to about 515 nm, and less than or equal to about 550 nm, less than or equal to about 540 nm, less than or equal to about 535 nm, less than or equal to about 530 nm, less than or equal to about 525 nm, or less than or equal to about 520 nm. The second region of the first optical filter layer blocks (e.g., absorb) blue light and green light and transmits light having a wavelength of a predetermined range, e.g., a wavelength of greater than or equal to about 600 nm, greater than or equal to about 610 nm, or greater than or equal to about 615 nm and less than or equal to about 650 nm, less than or equal to about 640 nm, less than or equal to about 635 nm, less than or equal to about 630 nm, less than or equal to about 625 nm, or less than or equal to about 620 nm. The first region of the first optical filter layer may be disposed (directly) on or over a location overlapping a green light emitting section and the second region of the first optical filter layer may be disposed (directly) on or over a location overlapping a red light emitting section. The first region and the second region may be optically isolated from one another, for example, by a black matrix. The first optical filter layer may contribute to improving the color purity of a display device.

The first optical filter layer may be a reflection type filter including a plurality of layers (e.g., inorganic material layers) each having a different refractive index. For example, in the first optical filter layer, two layers having different refractive indices may be alternately stacked on each other. For example, a layer having a high refractive index and a layer having a low refractive index may be alternately laminated with each other.

The display device may further include a second optical filter layer 311 (e.g., red/green light or yellow light recycling layer) that is disposed between the light emitting layer 230 and the liquid crystal layer 220, and between the light emitting layer 230—(e.g., the quantum dot polymer composite layer) and the upper polarizer 300. The second optical filter layer 311 may transmit at least a portion of a third light, and reflect at least a portion of a first light, a second light, or a first light and a second light. The second optical filter layer may reflect light having a wavelength of greater than 500 nm. The first light may be green (or red) light, the second light may be red (or green) light, and the third light may be blue light.

Figure 4:
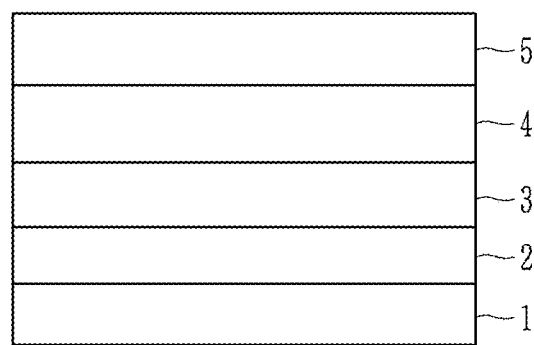
FIG. 4 is a schematic cross-sectional view of a light emitting device according to an embodiment.

The quantum dots may be used in a luminescent layer in a quantum dot based electroluminescent device (see FIG. 4). The electroluminescent device may include an anode 1 and a cathode 5 facing each other; a quantum dot emission layer 3 disposed between the anode and the cathode and including a plurality of quantum dots, and a hole auxiliary layer 2 disposed between the anode and the quantum dot emission layer. The hole auxiliary layer may include a hole injecting layer (HIL), a hole transporting layer (HTL), an electron blocking layer (EBL), or a combination thereof. The hole auxiliary layer may include a suitable organic/inorganic material having a hole property. The electroluminescent device may further include an electron auxiliary layer 4 between the cathode and the quantum dot emission layer. The electron auxiliary layer may include an electron injecting layer (EIL), an electron transporting layer (ETL), a hole blocking layer (HBL), or a combination thereof. The electron auxiliary layer may include a suitable organic/inorganic material having an electron property.

In an embodiment, the electronic device including the quantum dot(s) may include a display device, a light emitting diode (LED), an organic light emitting diode (OLED), a QD LED, a sensor, a solar cell, an imaging sensor, or a liquid crystal display (LCD), but is not limited thereto.

Hereinafter, the embodiments are illustrated in more detail with reference to examples. However, they are exemplary examples of the present disclosure, and the present disclosure is not limited thereto.

EXAMPLES

Analysis Method

1. Photoluminescence Analysis

A photoluminescence (PL) spectrum of the produced nanocrystals are obtained using a Hitachi F-7000 spectrometer at an irradiation wavelength of 372 nanometers (nm).

2. Ultraviolet (UV) Spectroscopy Analysis

UV spectroscopy analysis is performed using an Agilent Cary 5000 spectrometer to obtain a UV-Visible absorption spectrum.

3. Inductively Coupled Plasma (ICP) Analysis

An inductively coupled plasma-atomic emission spectroscopy (ICP-AES) analysis is performed using Shimadzu ICPS-8100.

4. Transmission Electron Microscopy (TEM) Analysis

A TEM analysis is performed using UT F30 Tecnai electron microscope.

Synthesis is performed under an inert gas atmosphere (nitrogen flowing condition) unless particularly mentioned.

Example 1

1. Selenium and tellurium are dispersed in trioctylphosphine (TOP) to obtain a 0.4 molar (M) Se/TOP stock solution and a 0.5 M Te/TOP stock solution. The Te/TOP stock solution, an organic ligand including oleyl amine, and lithium aluminum hydride are mixed to prepare a mixed solution.

In a 300 milliliters (mL) reaction flask, 0.9 mmol of zinc acetate is dissolved in octadecene together with oleic acid, and is heated under vacuum at 120° C. In one hour, an atmosphere in the reactor is changed into an inert gas and a reaction system is heated to 300° C.

To the heated reaction system is injected the Se/TOP stock solution and the mixed solution, and a reaction is carried out and terminated.

The reactor is cooled to room temperature and acetone is added thereto to obtain precipitates, which are separated via centrifugation, providing ZnTeSe cores. The obtained ZnTeSe cores are dispersed in toluene.

The used amounts of Zn and Se with respect to one mole of Te are controlled to provide a desired composition that will be described below as an ICP results taking into consideration reactivity of each of the precursors. With respect to one mole of Te, the used amount of the hydride compound is 1 mole.

2. Sulfur is dispersed in trioctylphosphine (TOP) to obtain a 1 molar (M) S/TOP stock solution.

In a 300 mL reaction flask, trioctylamine (TOA) is placed and zinc acetate and oleic acid are added thereto, then the mixture is heated under vacuum at 120° C. for one hour. Then, the atmosphere in the flask is replaced with an inert atmosphere, the flask is heated to 250° C.

To the heated reaction system are added the ZnTeSe cores prepared above and the S/TOP stock solution and the reaction proceeds for 30 minutes.

After the completion of the reaction, the flask is cooled to room temperature and acetone is added thereto to generate precipitation, from which the ZnTeSe/ZnS core-shell quantum dots are recovered via centrifugation. The obtained core-shell quantum dots are dispersed in toluene.

3.6 Moles of the sulfur is used per 1 mole of the Te precursor.

With respect to the cores and the core-shell quantum dots as prepared, a TEM analysis is made and the results are shown in Table 1 and Table 2.

With respect to the cores and the core-shell quantum dots as prepared, a UV-Vis absorption spectroscopy analysis and a photoluminescent spectroscopy analysis are made and some of the results are summarized in Table 1 and Table 2. With respect to the core-shell quantum dots as prepared, an ICP AES analysis is made and the results are shown in Table 3.

Example 2

Except that during the core synthesis, a concentration of Te/TOP is adjusted to 1M, a ZnTeSe core and a ZnTeSe/ZnS core-shell quantum dot are prepared in the same manner as in Example 1.

With respect to the cores and the core-shell quantum dots as prepared, a TEM analysis is made and the results are shown in Table 1 and Table 2.

With respect to the cores and the core-shell quantum dots as prepared, a UV-Vis absorption spectroscopy analysis and a photoluminescent spectroscopy analysis are made and some of the results are summarized in Table 1 and Table 2. The valley depth (VD) of the prepared core-shell quantum dot is confirmed to be about 0.05.

With respect to the core-shell quantum dots as prepared, an ICP AES analysis is made and the results are shown in Table 3.

Example 3

Except that during the core synthesis, a concentration of Te/TOP is adjusted to 1M and the amounts of the Zn precursor and the Se precursor with respect to 1 mole of Te are changed to obtain the following ICP data, a ZnTeSe core and a ZnTeSe/ZnS core-shell quantum dot are prepared in the same manner as in Example 1.

Figure 5A:
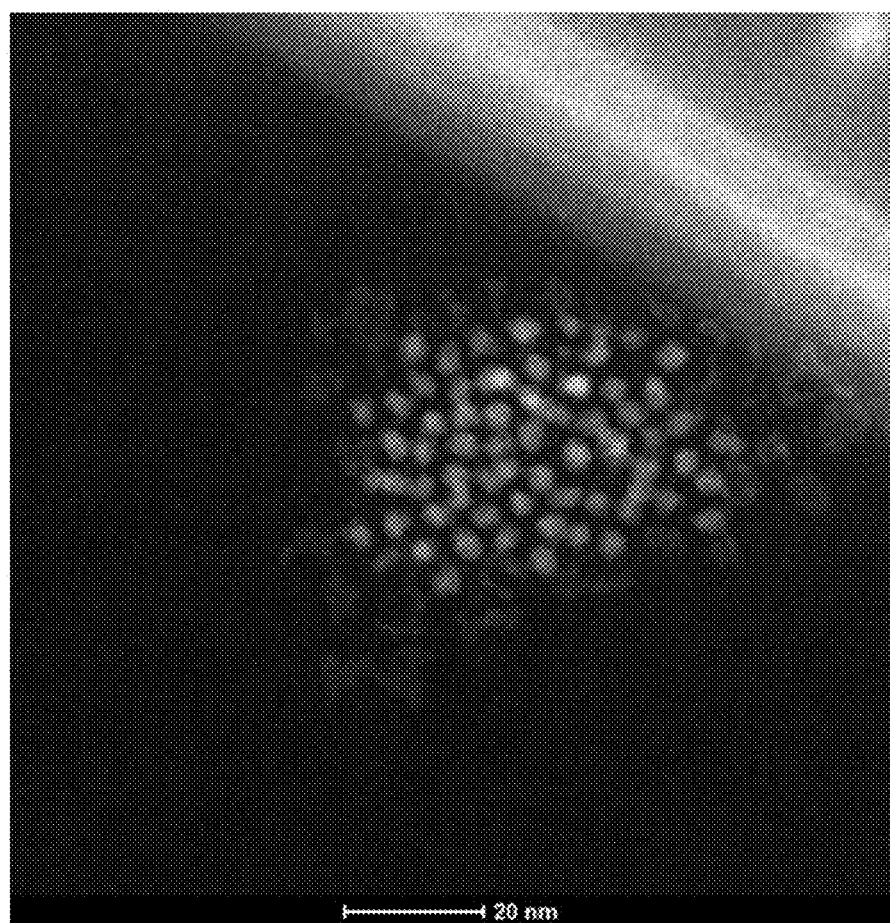
FIG. 5A is a Transmission Electron Microscopy (TEM) image of a core-shell quantum dot synthesized in Example 3.

With respect to the cores and the core-shell quantum dots as prepared, a TEM analysis is made and the results are shown in Table 1, Table 2, and FIG. 5A (for core-shell quantum dot).

Figure 5B:
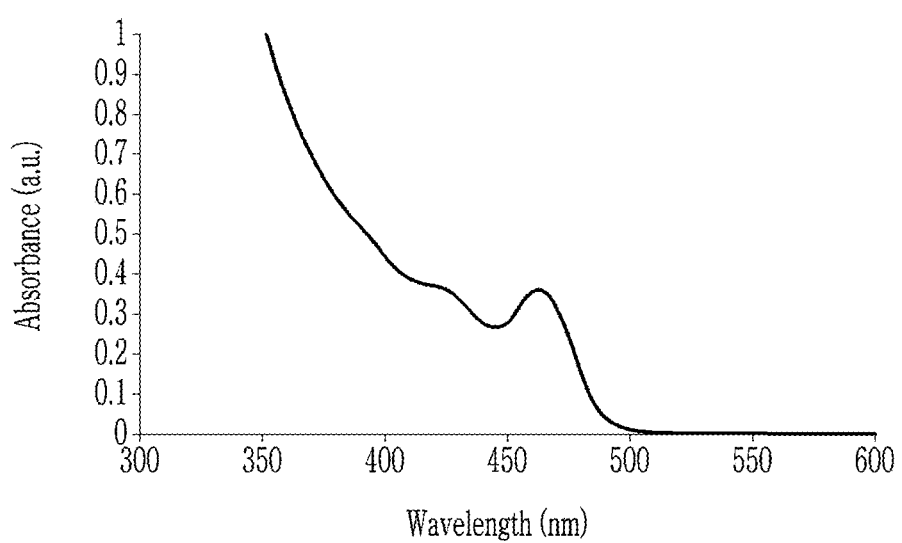
FIG. 5B is a graph of Absorbance (arbitrary units (a.u.)) versus Wavelength (nm) showing a UV-Vis absorption spectrum of a core of a core-shell quantum dot synthesized in Example 3.
Figure 5C:
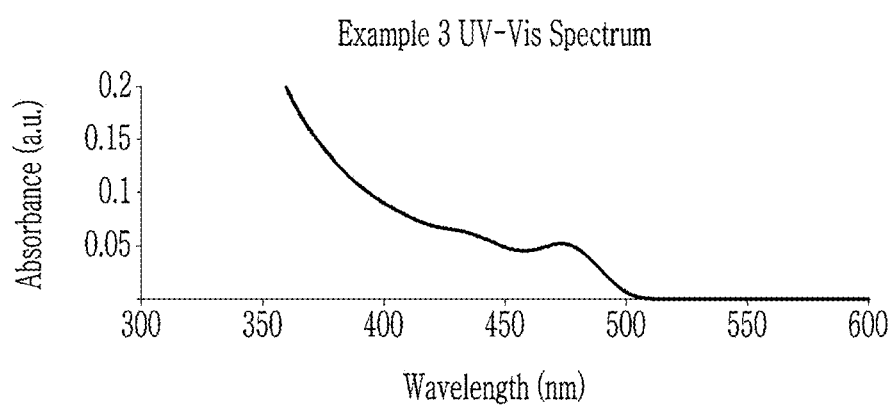
FIG. 5C is a graph of Absorbance (a.u.) versus Wavelength (nm) showing a UV-Vis absorption spectrum of a core-shell quantum dot synthesized in Example 3.
Figure 5D:
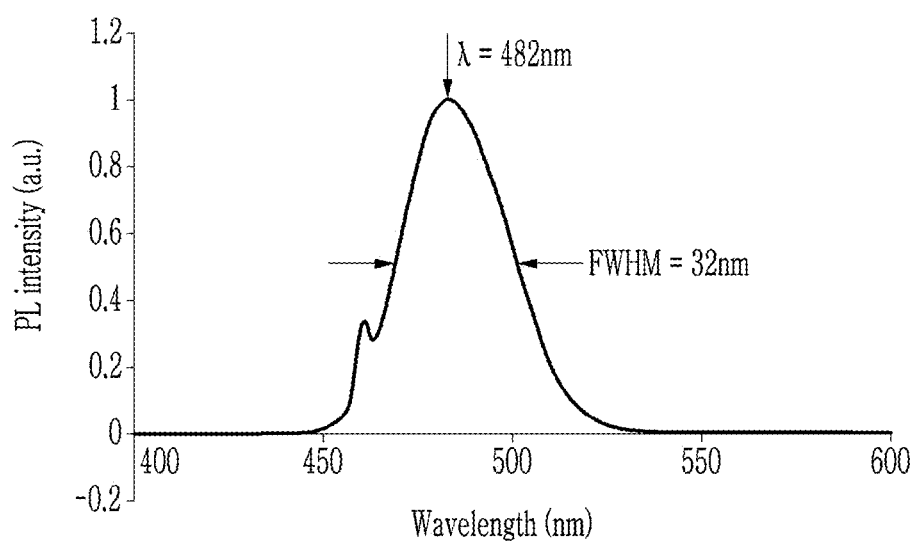
FIG. 5D is a graph of photoluminescence (PL) intensity (a.u.) versus Wavelength (nm) showing a photoluminescent spectrum of a core-shell quantum dot as synthesized in Example 3.

With respect to the cores and the core-shell quantum dots as prepared, a UV-Vis absorption spectroscopy analysis and a photoluminescent spectroscopy analysis are made and some of the results are summarized in Table 1 and Table 2 and FIG. 5B (Core UV), and FIGS. 5C and 5D (UV and PL of the core-shell quantum dots (QDs)). The valley depth (VD) of the prepared core-shell quantum dot is confirmed to be about 0.13.

With respect to the core-shell quantum dots as prepared, an ICP AES analysis is made and the results are shown in Table 3.

Comparative Example 1

Except that during the core synthesis, a concentration of Te/TOP is adjusted to 0.1M, a ZnTeSe core and a ZnTeSe/ZnS core-shell quantum dot are prepared in the same manner as in Example 1.

Figure 6A:
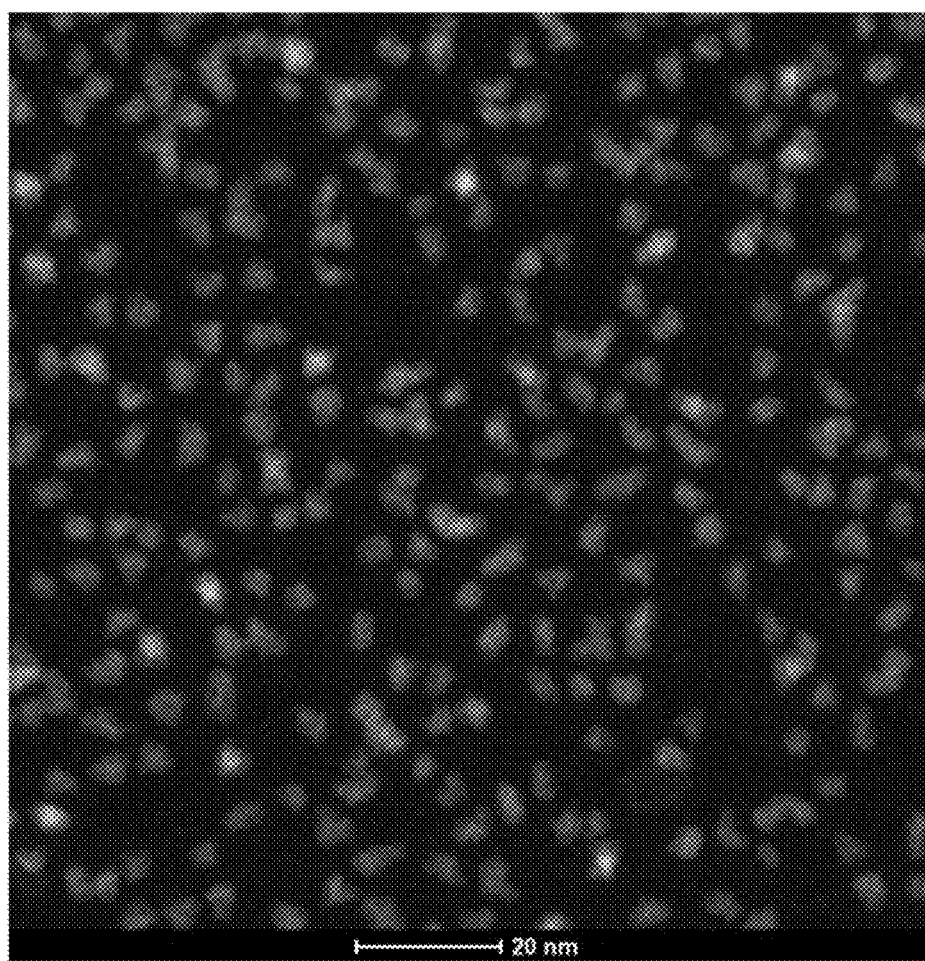
FIG. 6A is a TEM image of a core-shell quantum dot synthesized in Comparative Example 1.

With respect to the cores and the core-shell quantum dots as prepared, a TEM analysis is made and the results are shown in Table 1, Table 2, and FIG. 6A (for core-shell quantum dot).

Figure 6B:
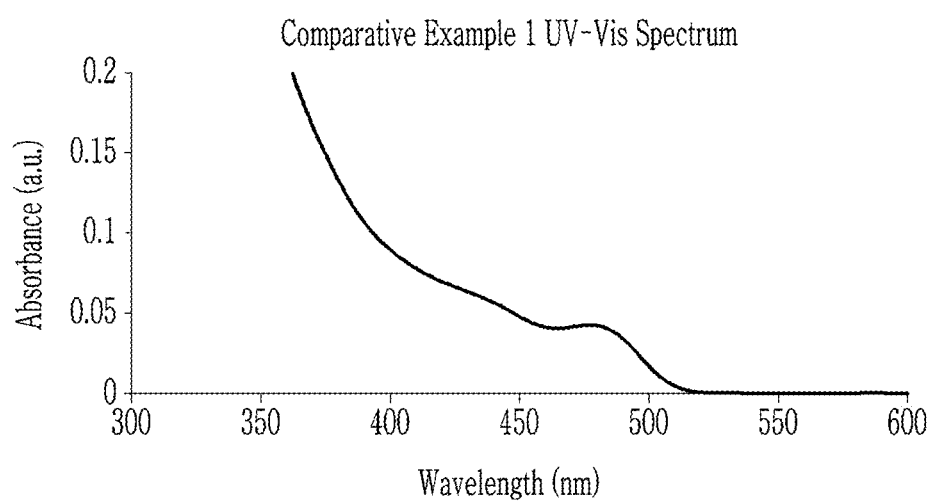
FIG. 6B is a graph of Absorbance (a.u.) versus Wavelength (nm) showing a UV-Vis absorption spectrum of a core of a core-shell quantum dot synthesized in Comparative Example 1.
Figure 6C:
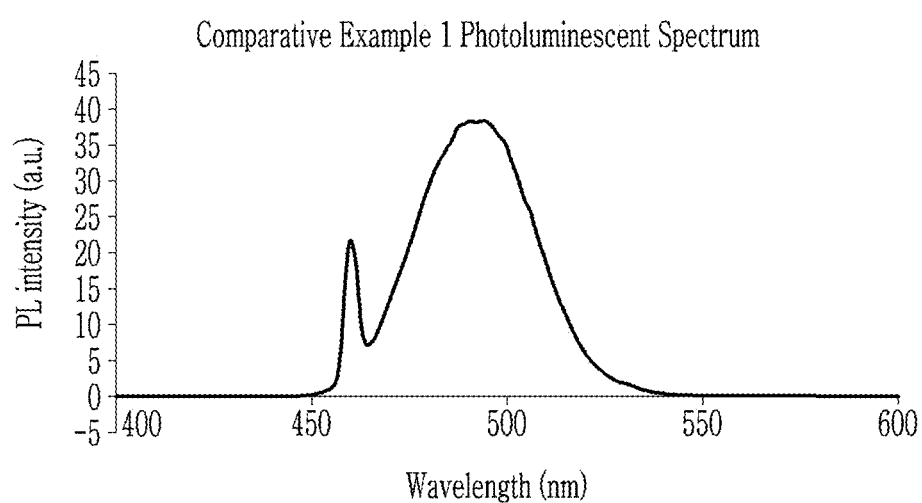
FIG. 6C is a graph of photoluminescence (PL) intensity (a.u.) versus Wavelength (nm) showing a photoluminescent spectrum of a core-shell quantum dot as synthesized in Comparative Example 1.

With respect to the cores and the core-shell quantum dots as prepared, a UV-Vis absorption spectroscopy analysis and a photoluminescent spectroscopy analysis are made and some of the results are summarized in Table 1 and Table 2 and FIGS. 6B and 6C (UV and PL of the core-shell QDs).

The valley depth (VD) of the prepared core-shell quantum dot is confirmed to be about 0.04.

With respect to the core-shell quantum dots as prepared, an ICP AES analysis is made and the results are shown in Table 3.

Comparative Example 2

Except for not using lithium aluminum hydride, a ZnTeSe core and a ZnTeSe/ZnS core-shell quantum dot are prepared in the same manner as in Example 1.

With respect to the cores and the core-shell quantum dots as prepared, a UV-Vis absorption spectroscopy analysis and a photoluminescent spectroscopy analysis are made. The prepared particles do not show luminous properties and do not have a VD value.

Example 4

Except that the core prepared in Example 3 is used and instead of the S/TOP stock solution, the Se/TOP stock solution is used, a ZnTeSe core and a ZnTeSe/ZnSe core-shell quantum dot are prepared in the same manner as in Example 1.

With respect to the cores and the core-shell quantum dots as prepared, a UV-Vis absorption spectroscopy analysis and a photoluminescent spectroscopy analysis are made and some of the results are summarized in Table 4.

Example 5

Except that the core prepared in Example 3 is used and in addition to the S/TOP stock solution, the Se/TOP stock solution is used, a ZnTeSe core and a ZnTeSe/ZnSeS core-shell quantum dot are prepared in the same manner as in Example 1. The used amounts of S Se with respect to one mole of Se is controlled to provide a desired composition that will be described as an ICP results taking into consideration reactivity of each of the precursors.

With respect to the cores and the core-shell quantum dots as prepared, a UV-Vis absorption spectroscopy analysis and a photoluminescent spectroscopy analysis are made and some of the results are summarized in Table 4.

TABLE 1

| core | VD and 1st absorption (abs.) peak | FWHM | PL wavelength (nm) | Average (Avg.) size (nm) | SD (%) | Roundness |
|---|---|---|---|---|---|---|
| Comp. Example 1 | 0.07 (456 nm) | 23.0 | 479 | 3.78 | 20 | 0.73 |
| Example 1 | 0.12 (464 nm) | 23.2 | 481 | 3.39 | 15 | 0.80 |
| Example 2 | 0.20 (459 nm) | 26.0 | 479 | 3.53 | 15 | 0.84 |
| Example 3 | 0.26 (463 nm) | 25.6 | 479 | 3.77 | 11 | 0.87 |

Roundness confirmed by Image J program

TABLE 2

| Core-shell | 1st absorption peak wavelength (nm) | FWHM (nm) | PLQY % (PL wavelength at 458 nm excitation) | Avg. Size (nm) | SD (%) | Roundness |
|---|---|---|---|---|---|---|
| Comp. Example 1 | 477 | 35.6 | 9 (491 nm) | 4.19 | 18 | 0.70 |
| Example 1 | 478 | 38.1 | 12 (490 nm) | 4.04 | 18 | 0.73 |
| Example 2 | 477 | 36.6 | 26 (491 nm) | 4.25 | 12 | 0.76 |
| Example 3 | 473 | 32.3 | 45 (482 nm) | 3.58 | 11 | 0.81 |

VD: Valley Depth
FWHM: Full Width at Half Maximum (nm)
PLQY: photoluminescent quantum efficiency (%)
Avg. Size: average size
SD: standard deviation The results of tables confirm that the quantum dots of Examples may show enhanced, e.g., improved, luminous properties in comparison with the quantum dots of Comp. Example 1.

TABLE 3

| | Mole ratio with respect to Te (as determined by ICP) | | | |
|---|---|---|---|---|
| | Zn:Te | Se:Te | Se:Te | Al:Te |
| Example 1 core | 2.70:1 | 0.51:1 | — | 0.8:1 |
| Example 2 core | 2.88:1 | 0.51:1 | — | 0.8:1 |
| Example 3 core | 3.29:1 | 0.47:1 | — | 0.7:1 |
| Example 3 core-shell | 3.01:1 | 0.45:1 | 0.50:1 | 0.3:1 |
| Example 4 core shell | 7.2:1 | 4.28:1 | — | 0.3:1 |
| Comp. Example 1 core | 2.81:1 | 0.45:1 | — | 0.8:1 |

TABLE 4

| | ZnTeSe core/shell quantum dots | | |
|---|---|---|---|
| Shell | PL wavelength at 458 nm excitation (nm) | FWHM | PLQY (%) |
| Example 4 ZnSe | 520 | 34 | 36 |
| Example 5 ZnSeS | 526 | 37 | 37 |

The results of Table 4 confirm that the quantum dots of the Examples may have enhanced, e.g., improved, optical properties.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot population comprising a plurality of quantum dots, each of the quantum dots comprising
zinc,
tellurium, and
selenium and
not comprising cadmium,
wherein a maximum luminescent peak of the quantum dots is present in a wavelength range of greater than about 470 nm and a quantum efficiency of the quantum dots is greater than or equal to about 10%,
wherein each of the quantum dots comprises a core comprising a first semiconductor nanocrystal comprising zinc, selenium, and tellurium, and a semiconductor nanocrystal shell disposed on the core, and wherein in the quantum dots, a mole ratio of tellurium with respect to selenium is greater than about 0.15:1 and less than or equal to 2.7.

2. The quantum dot population of claim 1, wherein in the quantum dots, a mole ratio of tellurium with respect to selenium is greater than about 0.2:1.

3. The quantum dot population of claim 1, wherein in the quantum dots, a mole ratio of tellurium with respect to selenium is less than or equal to about 2.5:1.

4. The quantum dot population of claim 1, wherein in the quantum dots, a mole ratio of tellurium with respect to zinc is greater than or equal to about 0.1:1.

5. The quantum dot population of claim 1, wherein the quantum dots comprise aluminum, lithium, or a combination thereof.

6. The quantum dot population of claim 1, wherein the quantum dots do not comprise manganese, copper, or a combination thereof.

7. The quantum dot population of claim 1, wherein the quantum dots do not comprise a Group III-V compound comprising indium or gallium.

8. The quantum dot population of claim 1, wherein a maximum photoluminescent peak wavelength of the quantum dots is in a range of greater than or equal to about 480 nanometers and less than or equal to about 560 nanometers.

9. The quantum dot population of claim 1, wherein the maximum photoluminescent peak of the quantum dots has a FWHM of less than or equal to about 40 nanometers.

10. The quantum dot population of claim 1, wherein the quantum efficiency is greater than or equal to about 20%.

11. The quantum dot population of claim 1, wherein the semiconductor nanocrystal shell comprises zinc; and selenium, sulfur, or a combination thereof.

12. The quantum dot population of claim 1, wherein the quantum dots comprises $ZnTe_xSe_{1-x}$, wherein x is greater than or equal to about 0.5 and less than or equal to about 0.9.

13. The quantum dot population of claim 1, wherein the semiconductor nanocrystal shell comprises ZnSe, ZnS, ZnSeS, or a combination thereof.

14. The quantum dot population of claim 1, wherein the quantum dots show a Zinc Blende crystal structure in an X-ray diffraction analysis.

15. The quantum dot population of claim 1, wherein the quantum dots comprise an organic ligand and the organic ligand comprises RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', RHPO(OH), $RPO(OH)_2$, $R_2POOH$, a polymeric organic ligand, or a combination thereof, wherein R and R' are the same or different and are each independently a substituted or unsubstituted C1 to C40 aliphatic hydrocarbon group, a substituted or unsubstituted C6 to C40 aromatic hydrocarbon group, or a combination thereof.

16. The quantum dot population of claim 1, wherein the quantum dots are water-insoluble.

17. The quantum dot population of claim 1, wherein an average roundness of the plurality of the quantum dots is greater than or equal to about 0.70.

18. The quantum dot population of claim 17, wherein an average size of the plurality of the quantum dots is greater than or equal to about 2 nanometers and less than or equal to about 50 nanometers.

19. The quantum dot population of claim 17, wherein a standard deviation of particle sizes of the plurality of the quantum dots is less than about 18% of an average size of the quantum dots.

20. A method of manufacturing the quantum dot population of claim 1, comprising:

preparing the core comprising the first semiconductor nanocrystal, the first semiconductor nanocrystal comprising zinc, tellurium, and selenium; and reacting a zinc precursor with a selenium precursor, a sulfur precursor, or a combination thereof in a third organic solvent, in the presence of the core particle and a third organic ligand at a shell formation temperature to form the semiconductor nanocrystal shell on the core, the semiconductor nanocrystal shell comprising zinc, and at least one of selenium, and sulfur, wherein the preparing of the core comprises preparing a zinc precursor organic solution comprising a zinc precursor and a first organic ligand in a first organic solvent; and while heating the zinc precursor organic solution at a first reaction temperature, adding to the zinc precursor organic solution a selenium precursor, a tellurium precursor, a metal hydride compound, and a second organic ligand, and wherein the tellurium precursor comprises tellurium dispersed in a second organic solvent and wherein a concentration of the tellurium in the tellurium precursor is greater than about 0.1 moles per liter.

21. The method of claim 20, wherein the first reaction temperature is greater than or equal to about 280° C.

22. A display device comprising a light emitting element, wherein the light emitting element comprises the quantum dot population of claim 1.

23. The display device of claim 22, wherein the light emitting element comprises a stacked structure comprising a patterned light emitting layer, wherein the patterned light emitting layer comprises a repeating section configured to emit light at a predetermined wavelength, and wherein the first repeating section comprises the quantum dots.

* * * * *